US012751130B2

(12) United States Patent
Song et al.

(10) Patent No.: US 12,751,130 B2
(45) Date of Patent: Sep. 29, 2026

(54) DISPLAY DEVICE

(71) Applicant: Samsung Display Co., LTD., Yongin-si (KR)

(72) Inventors: Myeong Hun Song, Yongin-si (KR); Sung Geun Bae, Yongin-si (KR); Jeong Hyun Lee, Yongin-si (KR); Jong Chan Lee, Yongin-si (KR); Tae Hee Lee, Yongin-si (KR); Woong Hee Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/120,970

(22) Filed: Dec. 14, 2020

(65) Prior Publication Data

US 2021/0367109 A1 Nov. 25, 2021

(30) Foreign Application Priority Data

May 21, 2020 (KR) ........................ 10-2020-0061131

(51) Int. Cl.
*H10H 29/32* (2025.01)
*H10H 20/813* (2025.01)
(Continued)

(52) U.S. Cl.
CPC .......... *H10H 29/32* (2025.01); *H10H 20/813* (2025.01); *H10H 29/49* (2025.01); *H10H 20/819* (2025.01)

(58) Field of Classification Search
CPC ..... H01L 33/62; H01L 33/08; H01L 25/0753; H10H 20/857; H10H 20/813–8132; H10H 29/857; H10H 29/30–49
See application file for complete search history.

(56) References Cited

U.S. PATENT DOCUMENTS

| | | | |
|---|---|---|---|
| 8,089,074 B2 | 1/2012 | Kim et al. | |
| 8,293,624 B2 | 10/2012 | Romano et al. | |

(Continued)

FOREIGN PATENT DOCUMENTS

| | | |
|---|---|---|
| CN | 101263610 A | 9/2008 |
| CN | 107256862 A | 10/2017 |

(Continued)

*Primary Examiner* — Lauren R Bell
(74) *Attorney, Agent, or Firm* — Womble Bond Dickinson (US) LLP

(57) ABSTRACT

A display device includes a light emitting element including a first semiconductor layer; a second semiconductor layer; and a third semiconductor layer disposed between the first semiconductor layer and the second semiconductor layer; a first contact electrode electrically connected to the first semiconductor layer of the light emitting element; a second contact electrode electrically connected to the second semiconductor layer of the light emitting element; and a third contact electrode disposed between the first contact electrode and the second contact electrode and electrically connected to the third semiconductor layer of the light emitting element, wherein the first semiconductor layer of the light emitting element and the second semiconductor layer of the light emitting element are doped with a first dopant having a first polarity, and the third semiconductor layer of the light emitting element is doped with a second dopant having a second polarity different from the first polarity.

20 Claims, 15 Drawing Sheets

(51) Int. Cl.
*H10H 20/819* (2025.01)
*H10H 29/49* (2025.01)

(56) References Cited

U.S. PATENT DOCUMENTS

| | | | | |
|---|---|---|---|---|
| 10,460,651 | B2 | 10/2019 | Kim | |
| 10,763,300 | B2 | 9/2020 | Tian et al. | |
| 11,074,858 | B2 | 7/2021 | Cho et al. | |
| 11,522,101 | B2 | 12/2022 | Wang | |
| 2008/0185595 | A1 | 8/2008 | Moon et al. | |
| 2018/0174506 | A1* | 6/2018 | Kim | G09G 3/32 |
| 2018/0175106 | A1* | 6/2018 | Kim | H01L 33/20 |
| 2020/0043400 | A1* | 2/2020 | Chen | G09G 3/22 |
| 2021/0175280 | A1* | 6/2021 | Chae | H01L 33/44 |
| 2021/0288217 | A1* | 9/2021 | Li | H01L 33/62 |
| 2022/0238759 | A1* | 7/2022 | Choi | H01L 33/382 |

FOREIGN PATENT DOCUMENTS

| | | | | |
|---|---|---|---|---|
| CN | 107924661 A | | 4/2018 | |
| CN | 109920891 A | | 6/2019 | |
| CN | 110137200 A | | 8/2019 | |
| KR | 10-2008-0073462 A | | 8/2008 | |
| KR | 10-2017-0021982 | | 3/2017 | |
| KR | 10-2019-0095803 | | 8/2019 | |
| KR | 10-2019-0096475 | | 8/2019 | |
| KR | 10-2020-0006650 | | 1/2020 | |
| KR | 10-2020-0010704 | | 1/2020 | |
| KR | 10-2020-0026677 A | | 3/2020 | |
| WO | WO-2020017718 A1 | * | 1/2020 | H01L 25/0753 |

* cited by examiner

DISPLAY DEVICE

CROSS-REFERENCE TO RELATED APPLICATION(S)

This application claims priority to and the benefit of Korean Patent Application No. 10-2020-0061131 under 35 U.S.C. § 119, filed in the Korean Intellectual Property Office on May 21, 2020, the entire contents of which are incorporated herein by reference.

BACKGROUND OF THE INVENTION

1. Technical Field

The disclosure relates to a display device.

2. Description of the Related Art

Recently, as interest in display devices has increased, research and development on display devices has been continuously conducted.

SUMMARY

The disclosure has been made in an effort to provide a display device that may improve material efficiency.

The objects of the disclosure are not limited to the object mentioned above, and other technical objects that are not mentioned may be clearly understood by a person of an ordinary skill in the art using the following description.

An embodiment of the disclosure provides a display device including a light emitting element including a first semiconductor layer; a second semiconductor layer; and a third semiconductor layer disposed between the first semiconductor layer and the second semiconductor layer; a first contact electrode electrically connected to the first semiconductor layer of the light emitting element; a second contact electrode electrically connected to the second semiconductor layer of the light emitting element; and a third contact electrode disposed between the first contact electrode and the second contact electrode and electrically connected to the third semiconductor layer of the light emitting element. The first semiconductor layer of the light emitting element and the second semiconductor layer of the light emitting element may be doped with a first dopant having a first polarity, and the third semiconductor layer of the light emitting element is doped with a second dopant having a second polarity different from the first polarity.

The light emitting element may further include a first active layer disposed between the first semiconductor layer of the light emitting element and the third semiconductor layer of the light emitting element; and a second active layer disposed between the second semiconductor layer of the light emitting element and the third semiconductor layer of the light emitting element.

The light emitting element may further include an insulating film surrounding at least a part of the first active layer and at least a part of the second active layer.

The insulating film of the light emitting element may include a contact hole exposing at least a part of the third semiconductor layer of the light emitting element.

The third contact electrode may directly contact the third semiconductor layer of the light emitting element through the contact hole.

The first contact electrode and the second contact electrode may be formed of a first conductive layer, the third contact electrode may be formed of a second conductive layer, and an insulating layer may be disposed between the first conductive layer and the second conductive layer.

The insulating layer may include an opening overlapping the third semiconductor layer of the light emitting element.

At least a part of the third contact electrode may be disposed in the opening of the insulating layer.

The display device may further include a fixed layer disposed between the light emitting element and the first conductive layer.

The fixed layer may include a first fixed layer disposed between the first semiconductor layer of the light emitting element and the first contact electrode, and a second fixed layer disposed between the second semiconductor layer of the light emitting element and the second contact electrode.

The first contact electrode may be formed of a first conductive layer, the second contact electrode may be formed of a second conductive layer, and the display device may further include a first insulating layer covering the first conductive layer and a second insulating layer covering the second conductive layer.

The first insulating layer and the second insulating layer may not overlap the third semiconductor layer of the light emitting element.

The third contact electrode may be disposed in direct contact with the first insulating layer and the second insulating layer.

Another embodiment of the disclosure provides a display device including a first electrode; a second electrode spaced apart from the first electrode; a third electrode disposed between the first electrode and the second electrode; a light emitting element disposed between the first electrode and the second electrode; a first contact electrode electrically contacting the first electrode and an end of the light emitting element; a second contact electrode electrically contacting the second electrode and another end of the light emitting element; and a third contact electrode disposed between the first contact electrode and the second contact electrode. The light emitting element may include a semiconductor core and an insulating film surrounding at least a part of the semiconductor core, and the third contact electrode electrically contacts the semiconductor core through a contact hole passing through the insulating film.

The semiconductor core may include a first semiconductor layer; a second semiconductor layer; and a third semiconductor layer disposed between the first semiconductor layer and the second semiconductor layer.

The third semiconductor layer of the semiconductor core may overlap the third electrode.

The third contact electrode may electrically contact the third semiconductor layer of the semiconductor core through the contact hole.

The first contact electrode may electrically contact the first semiconductor layer of the semiconductor core, and the second contact electrode may electrically contact the second semiconductor layer of the light emitting element.

The first semiconductor layer of the semiconductor core and the second semiconductor layer of the semiconductor core may be doped with a first dopant having a first polarity, and the third semiconductor layer of the semiconductor core is doped with a second dopant having a second polarity different from the first polarity.

The semiconductor core may further include a first active layer disposed between the first semiconductor layer and the third semiconductor layer; and a second active layer disposed between the second semiconductor layer and the third semiconductor layer.

Particularities of other embodiments are included in the detailed description and drawings.

According to the embodiment, since the display device includes the light emitting elements of the NPN and/or PNP junction, it is possible to prevent non-lighting defects of the reverse light emitting elements due to the existing deflection alignment, thereby improving material efficiency. Since heat generation and resistance due to the reverse light emitting element may be reduced, lifespan of the display panel may be improved.

Effects of embodiments of the disclosure are not limited by what is discussed above, and other various effects may be understood by a person of ordinary skill in the art with the disclosure.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
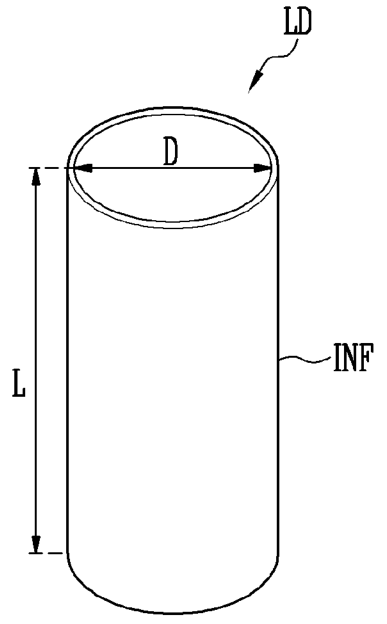
FIG. 1 and FIG. 2 illustrate a schematic perspective view and a schematic cross-sectional view of a light emitting element according to an embodiment, respectively.

Advantages and features of the disclosure and methods of accomplishing the same may be understood more readily by reference to the following detailed description of embodiments and the accompanying drawings. However, the disclosure is not limited to the exemplary embodiments described hereinafter and may be embodied in many different forms.

It will be understood that when an element or a layer is referred to as being, for example, "on," "under," "between," "surrounding," "covering," or "overlapping" another element or layer, it can be directly on, under, between, surrounding, covering, or overlapping another element or layer, or an intervening element or layer may also be present. Throughout the specification, the same reference numerals denote the same constituent elements.

Although the terms "first," "second," and the like are used to describe various constituent elements, these constituent elements are not limited by these terms. These terms are used only to distinguish one constituent element from another constituent element. Therefore, the first constituent elements described below may be the second constituent elements within the technical spirit of the disclosure. Singular forms are intended to include plural forms unless the context clearly indicates otherwise.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly defined in the specification.

Hereinafter, embodiments will be described in detail with reference to the accompanying the drawings.

Figure 2:
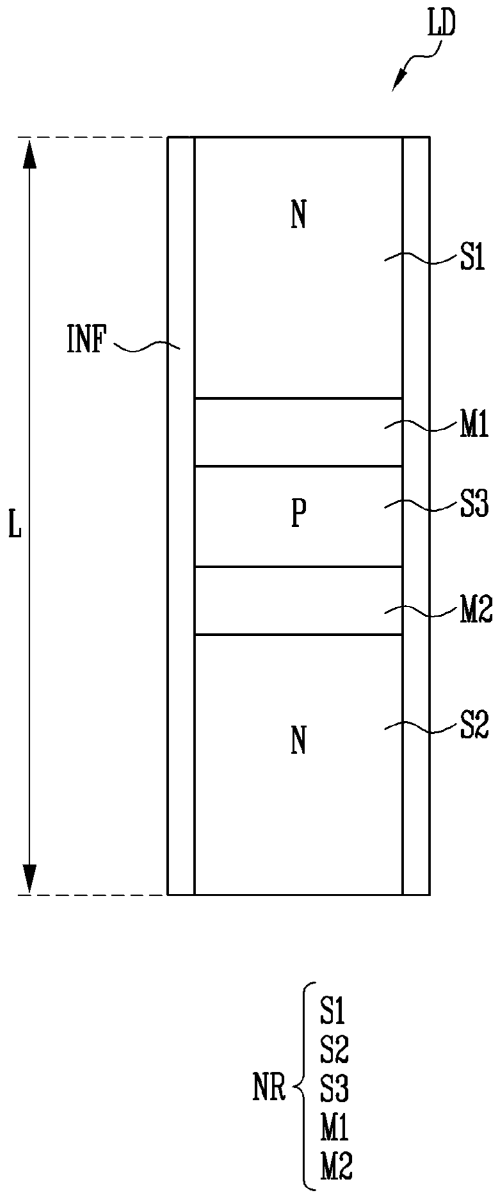

FIG. 1 and FIG. 2 illustrate a schematic perspective view and a schematic cross-sectional view of a light emitting element according to an embodiment, respectively. In FIG. 1 and FIG. 2, a cylindrical rod-shaped light emitting element LD is illustrated, but a type and/or shape of the light emitting element LD is not limited thereto.

Referring to FIG. 1 and FIG. 2, a light emitting element LD may include a semiconductor core NR and an insulating film INF surrounding the semiconductor core NR. The semiconductor core NR may include a first semiconductor layer S1, a second semiconductor layer S2, a third semiconductor layer S3, a first active layer M1 disposed between the first semiconductor layer S1 and the third semiconductor layer S3, and a second active layer M2 disposed between the second semiconductor layer S2 and the third semiconductor layer S3. For example, the semiconductor core NR may be formed as a stacked body in which the first semiconductor layer S1, the first active layer M1, the third semiconductor layer S3, the second active layer M2, and the second semiconductor layer S2 are sequentially stacked in one direction.

In some embodiments, the light emitting element LD may be a rod-shaped light emitting diode manufactured in a rod shape. Here, the rod shape includes a rod-like shape or a bar-like shape, a length of which is greater than a width thereof, such as a cylinder or polygonal column, but a shape of a cross section thereof is not limited. For example, a length L of the light emitting element LD may be greater than a diameter D thereof (or a width of a cross section thereof).

According to the embodiment, the light emitting element LD has a size as small as a nanometer scale to a micrometer scale, for example, a diameter D and/or a length L ranging from about 100 nm to about 10 um. However, the size of the light emitting element LD is not limited thereto. For example, the size of the light emitting element LD may be variously changed according to design conditions of various devices using a light emitting device using the light emitting element LD as a light source, for example, a display device.

In some embodiments, the light emitting element LD may have one end portion and the other end portion in one direction. The first semiconductor layer S1 may be disposed at one end portion of the light emitting element LD, and the second semiconductor layer S2 may be disposed at the other end portion.

The first semiconductor layer S1 may include at least one n-type semiconductor material. For example, the first semiconductor layer S1 may include one semiconductor material of InAlGaN, GaN, AlGaN, InGaN, AlN, and InN, and it may include an n-type semiconductor material doped with a first conductive dopant such as Si, Ge, and Sn, but is not necessarily limited thereto.

The second semiconductor layer S2 may include a semiconductor material of the same type as the first semiconductor layer S1. For example, the second semiconductor layer S2 may include at least one n-type semiconductor material. For example, the second semiconductor layer S2 may include one semiconductor material of InAlGaN, GaN, AlGaN, InGaN, AlN, and InN, and it may include an n-type semiconductor material doped with a first conductive dopant such as Si, Ge, and Sn, but is not necessarily limited thereto.

The second semiconductor layer S3 may be disposed between the first semiconductor layer S1 and the second semiconductor layer S2. The third semiconductor layer S3 may include a semiconductor material of a different type from the first semiconductor layer S1 and/or the second semiconductor layer S2. For example, the third semiconductor layer S3 may include at least one p-type semiconductor material. For example, the third semiconductor layer S3 may include at least one semiconductor material of InAlGaN, GaN, AlGaN, InGaN, AlN, and InN, and may include a p-type semiconductor material doped with a second conductive dopant such as Mg. However, the material included in the third semiconductor layer S3 is not limited thereto, and the third semiconductor layer S3 may be made of various materials. For example, the light emitting element LD may be an NPN junction light emitting element.

The first active layer M1 may be disposed between the first semiconductor layer S1 and the third semiconductor layer S3, and the second active layer M2 may be disposed between the second semiconductor layer S2 and the third semiconductor layer S3. The active layers M1 and M2 may be formed to have a single or multiple quantum well structures. In the embodiment, a clad layer (not shown) doped with a conductive dopant may be formed in upper and/or lower portions of the active layers M1 and M2. For example, the cladding layer may be formed of AlGaN or InAlGaN. In some embodiments, a material such as AlGaN or AlInGaN may be used to form the active layers M1 and M2, and various materials may form the active layers M1 and M2.

In case that a voltage of a threshold voltage or more is applied to both ends of the light emitting element LD, the light emitting element LD emits light while electron-hole pairs are combined in the active layers M1 and M2. By controlling the light emission of the light emitting element LD by using this principle, the light emitting element LD may be used as a light source for various light emitting devices in addition to pixels of a display device.

In some embodiments, the light emitting element LD may further include the insulating film INF provided on a surface thereof. The insulating film INF may be formed on the surface of the light emitting element LD so as to surround at least an outer circumferential surface of the active layers M1 and M2, and may further surround one region of the first to third semiconductor layers S1, S2, and S3.

However, in some embodiments, the insulating film INF may expose both end portions of the light emitting element LD. For example, the insulating film INF does not cover or overlap one end (for example, two planes of a cylinder (for example, upper and lower surface) of each of the first and second semiconductor layers S1 and S2 disposed at both ends of the light emitting element LD in a longitudinal direction but may expose it. In some embodiments, the insulating film INF may expose both end portions of the light emitting element LD and side portions of the semiconductor layers S1 and S2 adjacent to both end portions. The insulating film INF may include a contact hole (CH of FIG. 12) partially exposing the third semiconductor layer S3 for connection with the third semiconductor layer S3 after alignment of the light emitting element LD, and a detailed description thereof will be described with reference to FIG. 12 below.

In some embodiments, the insulating film INF may include at least one insulating material of a silicon dioxide ($SiO_2$), a silicon nitride ($Si_3N_4$), an aluminum oxide ($Al_2O_3$), and a titanium dioxide ($TiO_2$), but is not limited thereto.

In the embodiment, the light emitting element LD may further include an additional constituent element in addition to the semiconductor core NR and/or the insulating film INF. For example, the light emitting element LD may additionally include one or more of a phosphor layer, an active layer, a semiconductor material, and/or an electrode layer disposed on one side of the semiconductor core NR.

Figure 3:
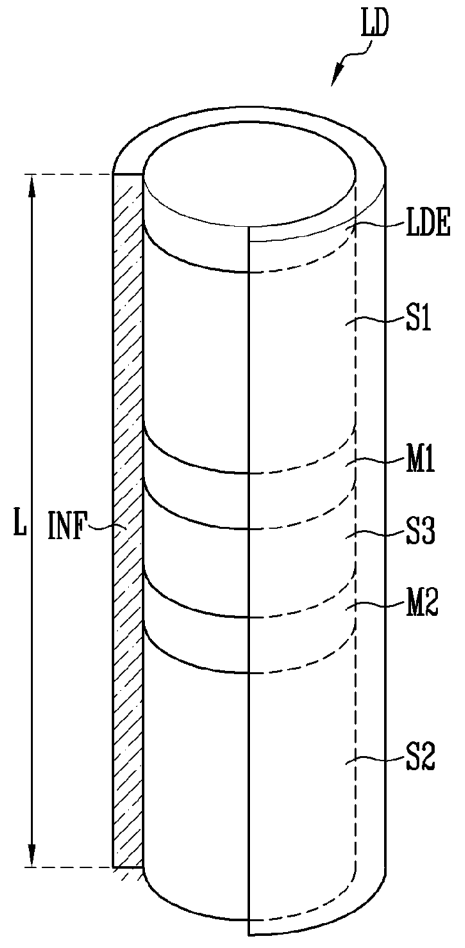
FIG. 3 illustrates a schematic perspective view of a light emitting element according to another embodiment.

FIG. 3 illustrates a schematic perspective view of a light emitting element according to another embodiment. In FIG. 3, a portion of the insulating film INF is omitted for convenience of description.

Referring to FIG. 3, the light emitting element LD may further include an electrode layer LDE disposed on the first semiconductor layer S1.

The electrode layer LDE may be an ohmic contact electrode electrically connected to the first semiconductor layer S1 but is not limited thereto. In some embodiments, the electrode layer LDE may be a Schottky contact electrode. The electrode layer LDE may include a metal or a metal oxide, and for example, Cr, Ti, Al, Au, Ni, ITO, IZO, ITZO, and an oxide thereof or an alloy thereof may be used alone or in combination therein. The electrode layer LDE may be substantially transparent or transflective. Accordingly, light generated by the active layers M1 and M2 of the light emitting element LD may transmit through the electrode layer LDE and may be emitted to the outside of the light emitting element LD.

Although not separately illustrated, in another embodiment, the light emitting element LD may further include an electrode layer disposed on the third semiconductor layer S3.

Figure 4:
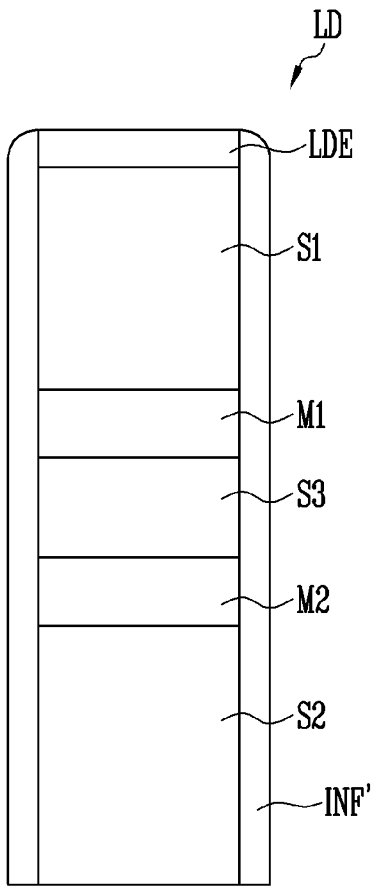
FIG. 4 illustrates a schematic cross-sectional view of a light emitting element according to another embodiment.

FIG. 4 illustrates a schematic cross-sectional view of a light emitting element according to another embodiment.

Referring to FIG. 4, an insulating film INF' may have a curved shape in a corner region adjacent to the electrode layer LDE. According to the embodiment, when the light emitting element LD is manufactured, the curved shape may be formed by etching. Although not separately shown, even in a light emitting element of another embodiment having the structure further including the electrode layer disposed on the third semiconductor layer S3, the insulating film INF' may have a curved shape in a region adjacent to the electrode layer.

Figure 5:
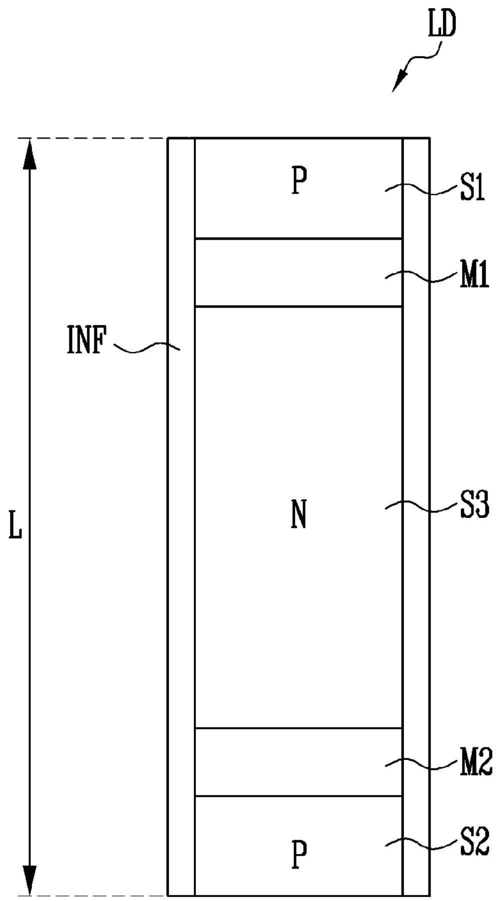
FIG. 5 illustrates a schematic cross-sectional view of a light emitting element according to another embodiment.

FIG. 5 illustrates a schematic cross-sectional view of a light emitting element according to another embodiment.

Referring to FIG. 5, the first semiconductor layer S1 may include at least one p-type semiconductor material. For example, the first semiconductor layer S1 may include at least one semiconductor material of InAlGaN, GaN, AlGaN, InGaN, AlN, and InN, and may include a p-type semiconductor material doped with a second conductive dopant such as Mg. However, the material included in the first semiconductor layer S1 is not limited thereto, and the first semiconductor layer S1 may be made of various materials.

The second semiconductor layer S2 may include a semiconductor material of the same type as the first semiconductor layer S1. For example, the second semiconductor layer S2 may include at least one semiconductor material of InAlGaN, GaN, AlGaN, InGaN, AlN, and InN, and may include a p-type semiconductor material doped with a second conductive dopant such as Mg.

The third semiconductor layer S3 may include a semiconductor material of a different type from the first semiconductor layer S1 and/or the second semiconductor layer S2. For example, the third semiconductor layer S3 may include at least one n-type semiconductor material. For example, the third semiconductor layer S3 may include one semiconductor material of InAlGaN, GaN, AlGaN, InGaN, AlN, and InN, and it may include an n-type semiconductor material doped with a first conductive dopant such as Si, Ge, and Sn. For example, the light emitting element LD may be a PNP junction light emitting element.

Besides, the active layers M1 and M2, and the insulating film INF have been described with reference to, e.g., FIG. 2, so duplicate contents are omitted.

The following embodiments will be described as an example to which the light emitting element LD shown in FIG. 1 and FIG. 2 is applied, but a person skilled in the art would be able to apply various types of light emitting elements including the light emitting element LD shown in FIG. 3 to FIG. 5 to embodiments.

Figure 6:
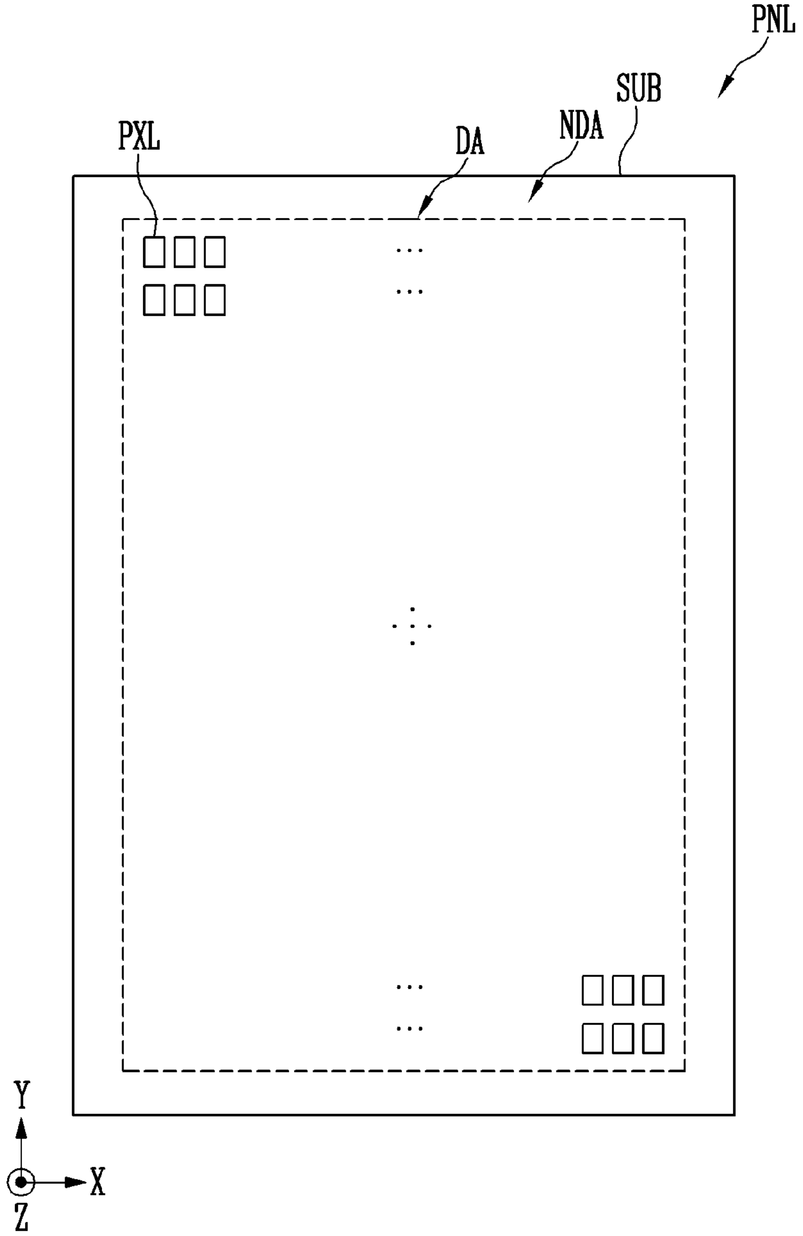
FIG. 6 illustrates a schematic plan view of a display device according to an embodiment.

FIG. 6 illustrates a plan view of a display device according to an embodiment.

FIG. 6 illustrates a display device, which is an example of a device that may use the above-described light emitting element LD as a light source, particularly, a display panel PNL provided in the display device.

Referring to FIG. 6, the display panel PNL may include a substrate SUB and a pixel PXL (or sub-pixel) disposed on the substrate SUB. Specifically, the display panel PNL and the substrate SUB may include a display area DA in which an image is displayed and a non-display area NDA excluding the display area DA.

The substrate SUB may be a rigid substrate or a flexible substrate, and its material or physical properties are not particularly limited. For example, the substrate SUB may be a rigid substrate made of glass or tempered glass, or a flexible substrate made of a thin film made of plastic or metal. The substrate SUB may be a transparent substrate but is not limited thereto. For example, the substrate SUB may be a translucent substrate, an opaque substrate, or a reflective substrate.

The display panel PNL and the substrate SUB may include a display area DA for displaying a screen and a non-display area NDA. The non-display area NDA may be disposed to surround the display area DA but is not limited thereto. The display area DA may include pixels PXL. The pixels PXL may include at least one light emitting element LD driven by a scan signal and a data signal, for example, at least one light emitting diode according to one of the embodiments of FIG. 1 to FIG. 5. The light emitting diodes may form a light source of the pixel PXL.

FIG. 6 illustrates an embodiment in which the pixels PXL are arranged in a stripe form in the display area DA, but the present invention is not limited thereto, and the pixels PXL may be arranged in various pixel arrangements currently known.

The pixel PXL may be electrically connected to a scan line and a data line and may also be electrically connected to a high potential power line and a low potential power line. The pixel PXL may emit light with luminance corresponding to the data signal transmitted through the data line in response to the scan signal transmitted through the scan line.

FIG. 7 to FIG. 10 illustrate a circuit diagram of a pixel according to an embodiment, respectively.

For example, FIG. 7 to FIG. 10 illustrate different embodiments of a pixel PXL that may be applied to an active display device. However, the types of the pixel PXL and the display device to which the embodiment may be applied are not limited thereto. In some embodiments, each pixel PXL illustrated in FIG. 7 to FIG. 10 may be one of the pixels PXL provided in the display panel PNL of FIG. 6, and the pixels PXL may substantially include the same pixel structure or pixel circuit.

Figure 7:
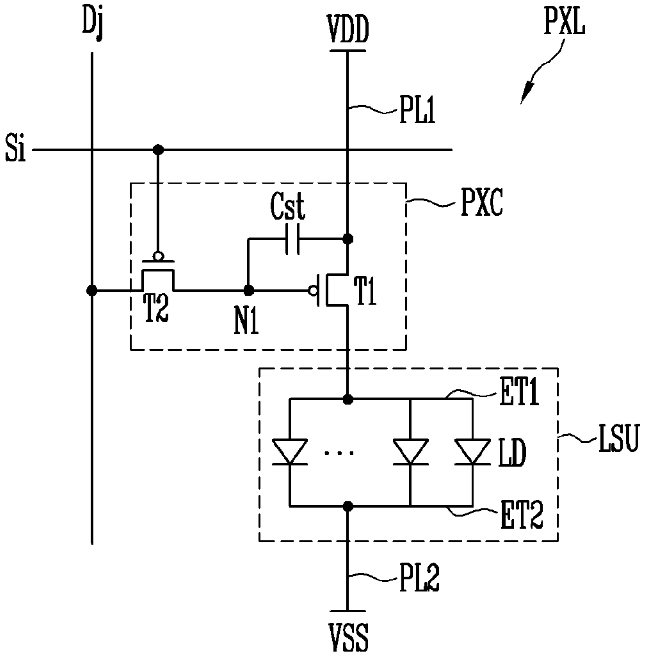
FIG. 7 to FIG. 10 illustrate schematic circuit diagrams of a pixel according to an embodiment, respectively.

First, referring to FIG. 7, the pixel PXL according to the embodiment may include a light emitting unit LSU for generating light having a luminance corresponding to a data signal and a pixel circuit PXC for driving the light emitting unit LSU.

In some embodiments, the light emitting unit LSU may include a light emitting elements LD electrically connected between a first power source VDD and a second power source VSS. For example, the light emitting unit LSU may include a first pixel electrode ET1 electrically connected to the first power source VDD via the pixel circuit PXC and a first power line PL1, a second pixel electrode ET2 electrically connected to the second power source VSS through a second power line PL2, and light emitting elements LD electrically connected in parallel in the same direction to each other between the first and second electrodes ET1 and ET2. In the embodiment, the first pixel electrode ET1 may be an anode electrode, and the second pixel electrode ET2 may be a cathode electrode.

In some embodiments, each of the light emitting elements LD may include a P-type end portion electrically connected to the first power source VDD through the first pixel electrode ET1 and an N-type end portion electrically connected to the second power source VSS through the second pixel electrode ET2. For example, the light emitting elements LD may be electrically connected in parallel in a forward direction between the first and second electrodes ET1 and ET2. As described above, respective light emitting elements LD electrically connected in the forward direction between the first power source VDD and the second power source VSS may form respective effective light sources, and these effective light sources may be combined to form the light emitting unit LSU of the pixel PXL.

In some embodiments, the first and second power sources VDD and VSS may have different potentials so that the light emitting elements LD may emit light. For example, the first power source VDD may be set as a high potential power source, and the second power source VSS may be set as a low potential power source. In this case, a potential difference between the first and second power sources VDD and VSS may be set to be equal to or higher than a threshold voltage of the light emitting elements LD during at least a light emitting period of the pixel PXL.

In some embodiments, the P-type end portions of the light emitting elements LD forming each light emitting unit LSU may be commonly and electrically connected to the pixel circuit PXC through one electrode (for example, the first pixel electrode ET1 of each pixel PXL) of the light emitting unit LSU and may be electrically connected to the first power source VDD through the pixel circuit PXC and the first power line PL1. The N-type end portions of the light emitting elements LD may be commonly and electrically connected to the second power source VSS through another electrode (for example, the second pixel electrode ET2 of each pixel PXL) of the light emitting unit LSU and the second power line PL2.

The light emitting elements LD of the light emitting unit LSU may emit light with a luminance corresponding to a driving current supplied through the corresponding pixel circuit PXC. For example, during each frame period, the pixel circuit PXC may supply a driving current corresponding to a gray value of corresponding frame data to the light emitting unit LSU. The driving current supplied to the light emitting unit LSU may be divided to flow in the light emitting elements LD that are electrically connected in a forward direction. Therefore, while each light emitting element LD emits light with a luminance corresponding to the current flowing therein, the light emitting unit LSU may emit light having a luminance corresponding to the driving current.

The pixel circuit PXC may be electrically connected to a scan line Si and a data line Dj of the corresponding pixel PXL. For example, in case that the pixel PXL is disposed in an i-th row (i is a natural number) and a j-th column (j is a natural number) of the display area DA, the pixel circuit 144 of the pixel PXL may be electrically connected to an i-th scan line Si and a j-th data line Dj of the display area DA. In some embodiments, the pixel circuit PXC may include first and second transistors T1 and T2 and a storage capacitor Cst.

The first transistor T1 (also referred to as a "driving transistor") is connected between the first power source VDD and the light emitting unit LSU. A gate electrode of the first transistor T1 is electrically connected to a first node N1. The first transistor T1 controls a driving current supplied to the light emitting unit LSU in response to a voltage of the first node N1.

The second transistor T2 (also referred to as a "switching transistor") is connected between the data line Dj and the first node N1. A gate electrode of the second transistor T2 is electrically connected to the scan line Si. In case that a scan signal of a gate-on voltage (for example, a low level voltage) is supplied from the scan line Si, the second transistor T2 is turned on to electrically connect the data line Dj and the first node N1.

A data signal of a corresponding frame is supplied to the data line Dj for each frame period, and the data signal is transmitted to the first node N1 via the second transistor T2. Accordingly, a voltage corresponding to the data signal is charged in the storage capacitor Cst.

One electrode of the storage capacitor Cst is electrically connected to the first power source VDD, and the other electrode thereof is electrically connected to the first node N1. The storage capacitor Cst is charged with a voltage corresponding to the data signal supplied to the first node N1 during each frame period.

FIG. 7 illustrates the transistors included in the pixel circuit PXC, for example, the first and second transistors T1 and T2 as P-type transistors, but the embodiments are not limited thereto. For example, at least one of the first and second transistors T1 and T2 may be changed as an N-type transistor.

Figure 8:
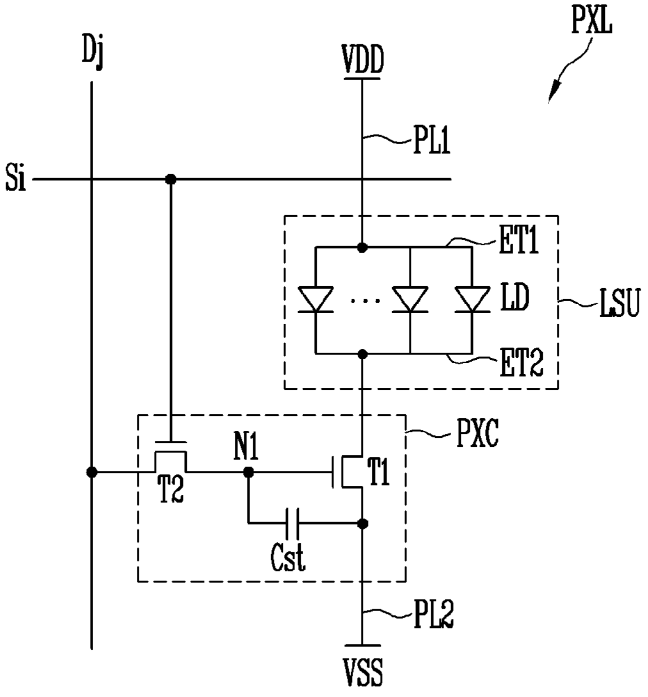

For example, as shown in FIG. 8, both the first and second transistors T1 and T2 may be N-type transistors. In this case, a gate-on voltage of the scan signal for writing the data signal supplied to the data line Dj for each frame period to the pixel PXL may be a high level voltage (also referred to as "gate-high voltage"). Similarly, a voltage of the data signal for turning on the first transistor T1 may be a voltage having a level opposite to the embodiment of FIG. 7. For example, in the embodiment of FIG. 8, as a gray value to be expressed increases, a higher voltage data signal can be supplied.

In the embodiment, an interconnection position of the pixel circuit PXC and the light emitting unit LSU may be changed. For example, as shown in FIG. 8, in case that both the first and second transistors T1 and T2 included in the pixel circuit PXC are N-type transistors, the pixel circuit PXC may be electrically connected between the light emitting unit LSU and the second power source VSS, the storage capacitor Cst may be electrically connected between the first node N1 and the second power source VSS. However, the disclosure is not limited thereto. For example, in another embodiment, even if the pixel circuit PXC is formed of N-type transistors, the pixel circuit PXC may be electrically connected between the first power source VDD and the light emitting unit LSU, and the storage capacitor Cst may be electrically connected between the first node N1 and the first power source VDD.

The configuration and operation of the pixel PXL illustrated in FIG. 8 are substantially similar to those of the pixel PXL in FIG. 7, except that a connection position of some circuit elements and a voltage level of the control signals (for example, scan signal and data signal) are changed according to a type of transistor. Therefore, a detailed description of the pixel PXL of FIG. 8 will be omitted.

The structure of the pixel circuit PXC is not limited to the embodiments illustrated in FIG. 7 and FIG. 8. For example, the pixel circuit PXC may be configured as a pixel circuit having various structures and/or driving methods currently known. For example, the pixel circuit PXC may be configured as in the embodiment shown in FIG. 9.

Figure 9:
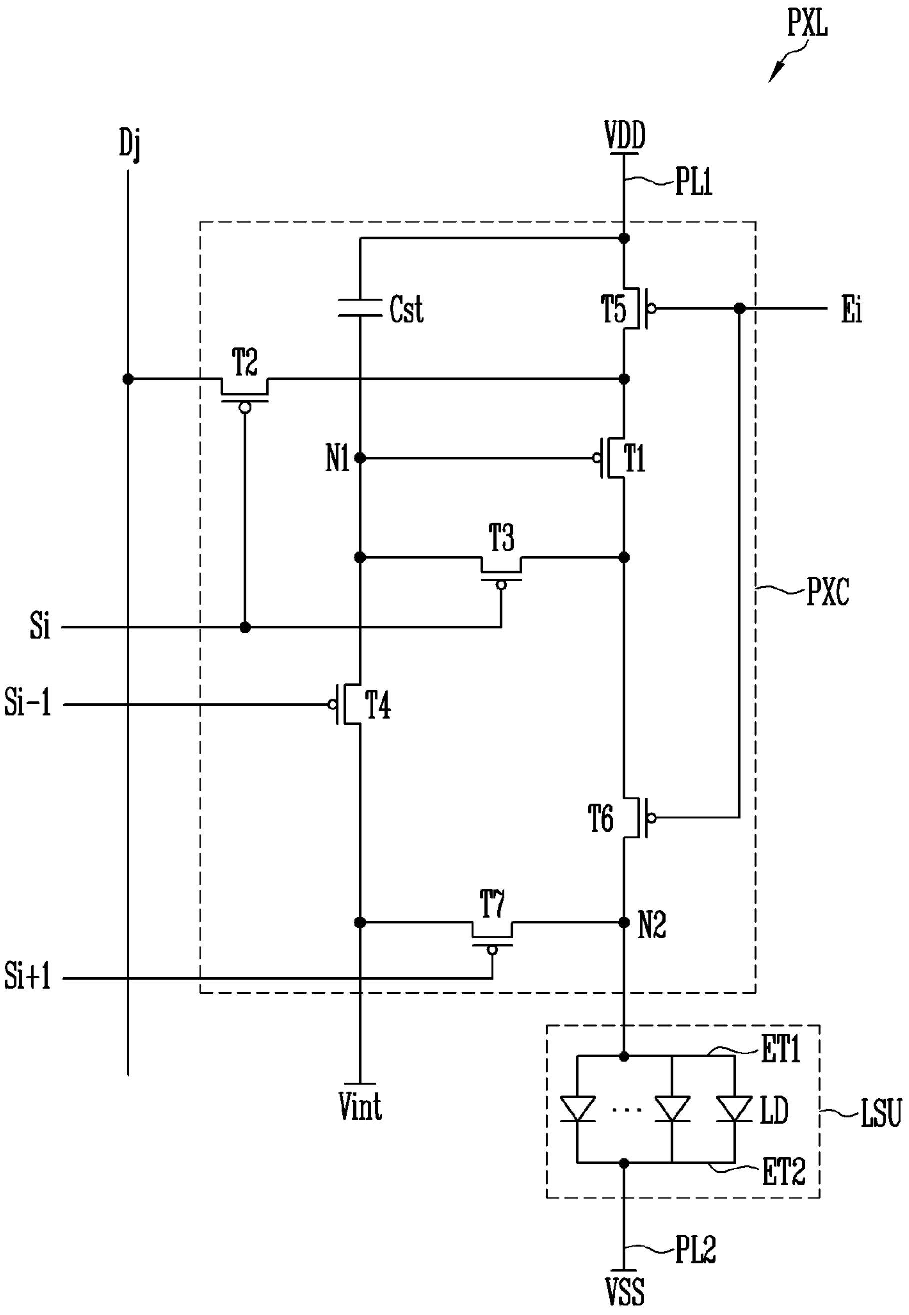

Referring to FIG. 9, the pixel circuit PXC may be further electrically connected to at least one other scan line (or control line) in addition to the scan line Si of a corresponding horizontal line. For example, the pixel circuit PXC of the pixel PXL disposed in an i-th row of the display area DA may be further electrically connected to an (i−1)-th scan line Si−1 and/or an (i+1)-th scan line Si+1. In an embodiment, the pixel circuit PXC may be further electrically connected to a third power source in addition to the first and second power sources VDD and VSS. For example, the pixel circuit PXC may also be electrically connected to an initialization power source Vint. In some embodiments, the pixel circuit PXC may include first to seventh transistors T1 to T7 and a storage capacitor Cst.

The first transistor T1 is connected between the first power source VDD and the light emitting unit LSU. For example, one electrode (for example, a source electrode) of the first transistor T1 may be electrically connected to the first power source VDD through the fifth transistor T5 and the first power line PL1, and the other electrode (for example, a drain electrode) of the first transistor T1 may be electrically connected to one electrode (for example, the first pixel electrode ET1 of the corresponding pixel PXL) of the light emitting unit LSU through the sixth transistor T6. A gate electrode of the first transistor T1 is electrically connected to a first node N1. The first transistor T1 controls a driving current supplied to the light emitting unit LSU in response to a voltage of the first node N1.

The second transistor T2 is connected between the data line Dj and one electrode of the first transistor T1. A gate electrode of the second transistor T2 is electrically connected to the corresponding scan line Si. In case that a scan signal of a gate-on voltage is supplied from the scan line Si, the second transistor T2 is turned on to electrically connect the data line Dj to one electrode of the first transistor T1. Therefore, in case that the second transistor T2 is turned on, the data signal supplied from the data line Dj is transmitted to the first transistor T1.

The third transistor T3 is connected between the other electrode of the first transistor T1 and the first node N1. A gate electrode of the third transistor T3 is electrically connected to a corresponding scan line Si. In case that the scan signal of the gate-on voltage is supplied from the scan line Si, the third transistor T3 is turned on to electrically connect the first transistor T1 in a form of a diode.

The fourth transistor T4 is connected between the first node N1 and the initialization power source Vint. A gate electrode of the fourth transistor T4 is electrically connected to the previous scan line, for example, the (i−1)-th scan line Si−1. In case that the scan signal of the gate-on voltage is supplied to the (i−1)-th scan line Si−1, the fourth transistor T4 is turned on to transmit the voltage of the initialization power source Vint to the first node N1. In some embodiments, in case that the first transistor T1 is a P-type transistor, the voltage of the initialization power source Vint for initializing the gate voltage of the first transistor T1 may be equal to or less than a minimum voltage of the data signal.

The fifth transistor T5 is connected between the first power source VDD and the first transistor T1. A gate electrode of the fifth transistor T5 is electrically connected to the corresponding emission control line, for example, an i-th emission control line Ei. In case that an emission control signal of a gate-off voltage (for example, a high level voltage) is supplied to the emission control line Ei, the fifth transistor T5 is turned off, and the fifth transistor T5 may be turned on in other cases.

The sixth transistor T6 is connected between the first transistor T1 and a second node N2, which is electrically connected to the light emitting unit LSU. A gate electrode of the sixth transistor T6 is electrically connected to the corresponding emission control line, for example, the i-th emission control line Ei. In case that the emission control signal having the gate-off voltage is supplied to the emission control line Ei, the sixth transistor T6 is turned off, and is turned on in other cases.

The seventh transistor T7 is connected between the second node N2, which is electrically connected to one electrode (for example, the first pixel electrode ET1 of the corresponding pixel PXL) of the light emitting unit LSU, and the initialization power source Vint. A gate electrode of the seventh transistor T7 is electrically connected to one of the scan lines of a next stage (next horizontal pixel column), for example, the (i+1)-th scan line Si+1. In case that the scan signal of the gate-on voltage is supplied to the (i+1)-th scan line Si+1, the seventh transistor T7 is turned on to supply the voltage of the initialization power source Vint to one electrode of the light emitting unit LSU. Accordingly, during each initialization period in which the voltage of the initialization power source Vint is transmitted to the light emitting unit LSU, the voltage of one electrode of the light emitting unit LSU is initialized. The control signal for controlling the operation of the seventh transistor T7 may be variously changed. For example, in another embodiment, a gate electrode of the seventh transistor T7 may be electrically connected to the scan line of the corresponding horizontal line, for example, the i-th scan line Si. In this case, in case that the scan signal of the gate-on voltage is supplied to the i-th scan line Si, the seventh transistor T7 may be turned on to supply the voltage of the initialization power source Vint to one electrode of the light emitting unit LSU.

The storage capacitor Cst is electrically connected between the first power source VDD and the first node N1. The storage capacitor Cst stores a data signal supplied to the first node N1 in each frame period and a voltage corresponding to the threshold voltage of the first transistor T1.

FIG. 9 illustrates the transistors included in the pixel circuit PXC, for example, the first to seventh transistors T1 to T7 as P-type transistors, but the present invention is not limited thereto. For example, at least one of the first and seventh transistors T1 to T7 may be an N-type transistor.

Figure 10:
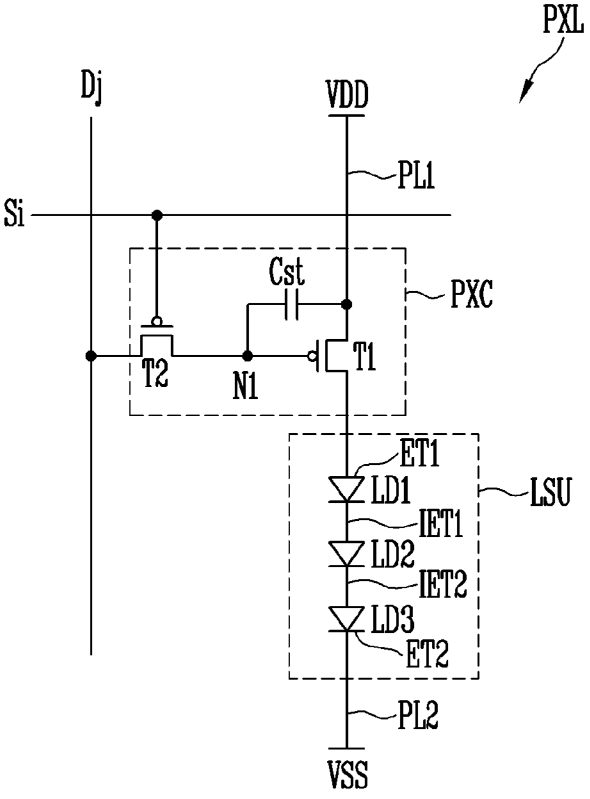

FIG. 7 to FIG. 9 illustrate the embodiments in which effective light sources forming each light emitting unit LSU, for example, the light emitting elements LD are all electrically connected in parallel, but the present invention is not limited thereto. For example, in another embodiment, as shown in FIG. 10, the light emitting unit LSU of each pixel PXL may be configured to include a series connection structure. In describing the embodiment of FIG. 10, a detailed description of the configuration (for example, the pixel circuit PXC) that is similar to or the same as the embodiments of FIG. 7 to FIG. 9 will be omitted.

Referring to FIG. 10, the light emitting unit LSU may include at least two light emitting elements electrically connected in series to each other. For example, the light emitting unit LSU may include a first light emitting element LD1, a second light emitting element LD2, and a third light emitting element LD3 that are electrically connected in series in a forward direction between the first power source VDD and the second power source VSS to form respective effective light source. A P-type end portion of the first light emitting element LD1 may be electrically connected to the first power source VDD through the first pixel electrode ET1 or the like of the light emitting unit LSU, and an N-type end portion of the first light emitting element LD1 may be electrically connected to a P-type end portion of the second light emitting element LD2 through a first intermediate electrode IET1. The P-type end portion of the second light-emitting element LD2 may be electrically connected to the N-type end portion of the first light emitting element LD1, and the N-type end portion of the second light emitting element LD2 may be electrically connected to a P-type end portion of the third light emitting element LD3 through a second intermediate electrode IET2. The P-type end portion of the third light emitting element LD3 may be electrically connected to the N-type end portion of the second light emitting element LD2, and an N-type end portion of the third light-emitting element LD3 may be electrically connected to the second power source VSS through the second pixel electrode ET2 of the light-emitting unit LSU and the second power line PL2. In the above-described manner, the first to third light emitting elements LD1, LD2, and LD3 may be sequentially and electrically connected in series between the first and second electrodes ET1 and ET2 of the light emitting unit LSU. FIG. 10 illustrates the embodiment in which light emitting elements LD are electrically connected in a three-stage series structure, but the present invention is not limited thereto. For example, in another embodiment, two light emitting elements LD may be electrically connected in a two-stage series structure, or four or more light emitting elements LD may be electrically connected in a four-stage or more series structure.

Figure 11:
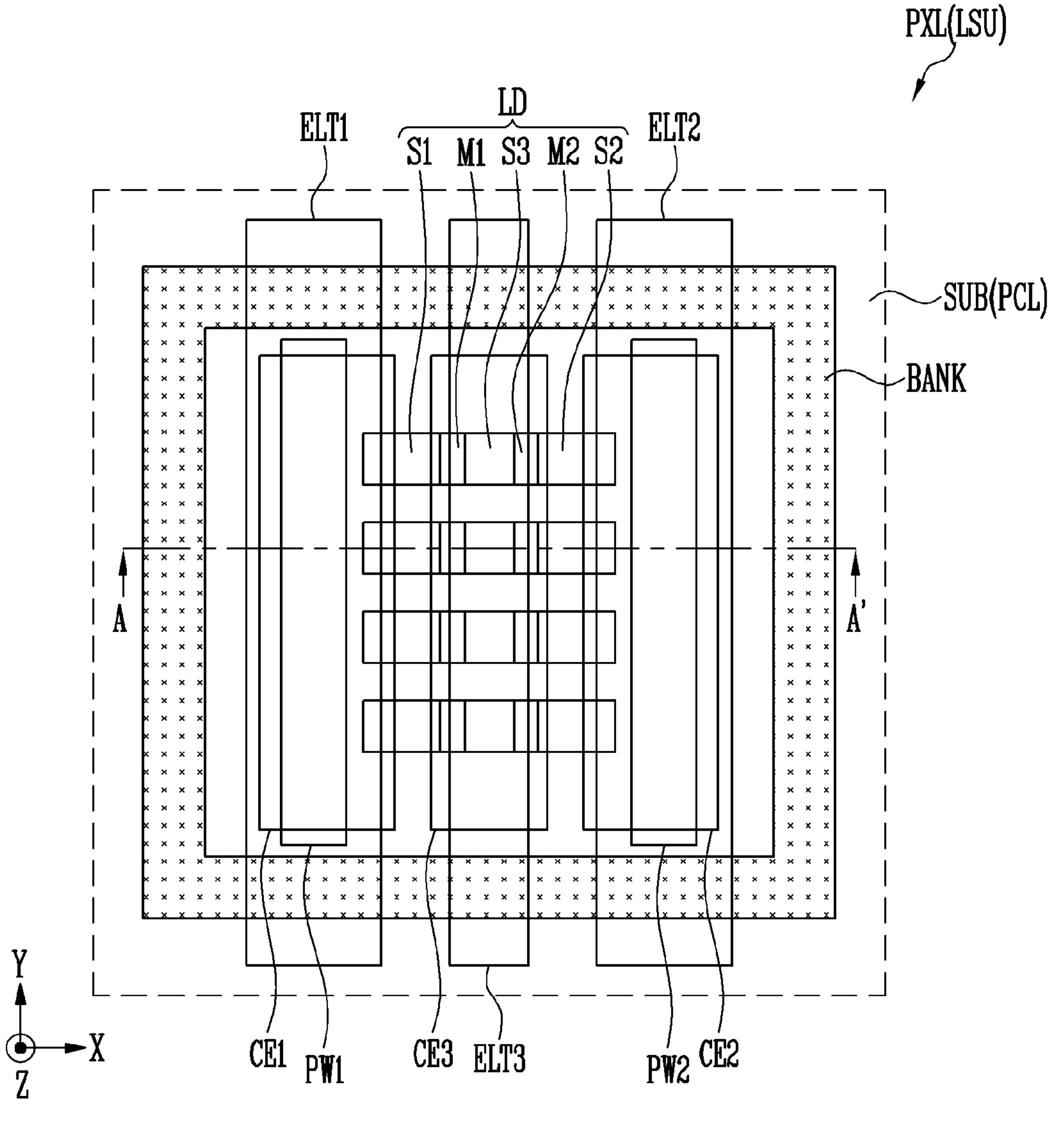
FIG. 11 illustrates a schematic plan view of an example of the pixel of FIG. 6.

FIG. 11 illustrates a plan view of an example of the pixel of FIG. 6.

Referring to FIG. 11, the pixel PXL may include a bank BANK (or a partition wall), and a light emitting area of the pixel PXL may be defined by the bank BANK.

The pixel PXL may include a first electrode ELT1, a second electrode ELT2, and a third electrode ELT3. Each of the first electrode ELT1, the second electrode ELT2, and the third electrode ELT3 may correspond to one of the first pixel electrode ET1 and/or the second pixel electrode ET2 described with reference to FIG. 7 to FIG. 10.

Each of the first electrode ELT1, the second electrode ELT2, and the third electrode ELT3 may extend in a second direction (Y-axis direction), and they may be disposed spaced apart from each other in a first direction (X-axis direction). The third electrode ELT3 may be disposed between the first electrode ELT1 and the second electrode ELT2 in a plan view. However, the disclosure is not limited thereto, and shapes and/or mutual arrangement relationships of the first electrode ELT1, the second electrode ELT2, and the third electrode ELT3 may be variously changed.

The first electrode ELT1 and/or the second electrode ELT2 may be electrically connected to the second power source VSS (or the second power line) described with reference to, e.g., FIG. 7, and the third electrode ELT3 may be electrically connected to the first transistor T1 described with reference to, e.g., FIG. 9.

In some embodiments, each of the first to third electrodes ELT1, ELT2, and ELT3 may have a single-layered or multi-layered structure. For example, the first to third electrodes ELT1, ELT2, and ELT3 may have a multi-layered structure including a reflective electrode and a conductive capping layer. The reflective electrode may have a single-layered or multi-layered structure. As an example, the reflective electrode may include at least one reflective conductive layer and may optionally further include at least one transparent conductive layer disposed above and/or below the reflective conductive layer.

In some embodiments, the pixel PXL may include a first bank pattern PW1 overlapping the first electrode ELT1 and a second bank pattern PW2 overlapping the second electrode ELT2.

The first bank pattern PW1 and the second bank pattern PW2 may be disposed spaced apart from each other and may respectively protrude one region of the first electrode ELT1 and the second electrode ELT2 in an upper direction, for example, in a third direction (Z-axis direction). For example, the first electrode ELT1 may be disposed on the first bank pattern PW1 and may protrude in the third direction (Z-axis direction) by the first bank pattern PW1, and the second electrode ELT2 may be disposed on the second bank pattern PW2 and may protrude in the third direction (Z-axis direction) by the second bank pattern PW2.

Light emitting elements LD may be provided in the bank BANK of the pixel PXL. The light emitting elements LD may be disposed between the first electrode ELT1 and the second electrode ELT2. The first semiconductor layer S1 of the light emitting element LD may face the first electrode ELT1; the second semiconductor layer S2 thereof may face the second electrode ELT2; and the third semiconductor layer S3 thereof may overlap the third electrode ELT3.

In some embodiments, the light emitting elements LD may be prepared in a form dispersed in a predetermined solution and may be supplied through an inkjet printing method or a slit coating method. For example, the light emitting elements LD may be mixed with a volatile solvent and be supplied. In this case, in case that a predetermined voltage is applied between the first to third electrodes ELT1, ELT2, and ELT3, an electric field is formed between the first to third electrodes ELT1, ELT2, and ELT3, and the light emitting elements LD are self-aligned between the first electrode ELT1 and the second electrode ELT2. As described above, in the case of using the light emitting element LD of the NPN and/or PNP junction, since both ends of the light emitting element LD include the same type of semiconductor layer, it is possible to prevent a non-light emitting defect due to deflection alignment. For example, it is possible to prevent the non-light emitting defect of the reverse-direction light emitting element due to the existing deflection alignment, thereby improving the material efficiency. A detailed description thereof will be described below. After the light emitting elements LD are arranged, the light emitting elements LD may be stably disposed between the first electrode ELT1 and the second electrode ELT2, by volatilizing the solvent or eliminating the solvent in another manner.

The pixel PXL may include a first contact electrode CE1, a second contact electrode CE2, and a third contact electrode CE3. Each of the first contact electrode CE1, the second contact electrode CE2, and the third contact electrode CE3 may extend in the second direction (Y-axis direction), and they may be disposed spaced apart from each other in the first direction (X-axis direction). The third contact electrode CE3 may be disposed between the first contact electrode CE1 and the second contact electrode CE2 in a plan view. However, the disclosure is not limited thereto, and shapes and/or mutual arrangement relationships of the first to third contact electrodes CE1, CE2, and CE3 may be variously changed.

The first contact electrode CE1 may be formed on at least one region of the first semiconductor layer S1 of the light emitting element LD and the corresponding first electrode ELT1 to physically and/or electrically connect the first semiconductor layer S1 of the light emitting element LD to the first electrode ELT1.

The second contact electrode CE2 may be formed in at least one region of the second semiconductor layer S2 of the light emitting element LD and the corresponding second electrode ELT2 and may physically and/or electrically connect the second semiconductor layer S2 of the light emitting element LD to the second electrode ELT2.

The third contact electrode CE3 may be formed in at least one region of the third semiconductor layer S3 of the light emitting element LD and the corresponding third electrode ELT3 and may physically and/or electrically connect the third semiconductor layer S3 of the light emitting element LD to the third electrode ELT3.

Figure 12:
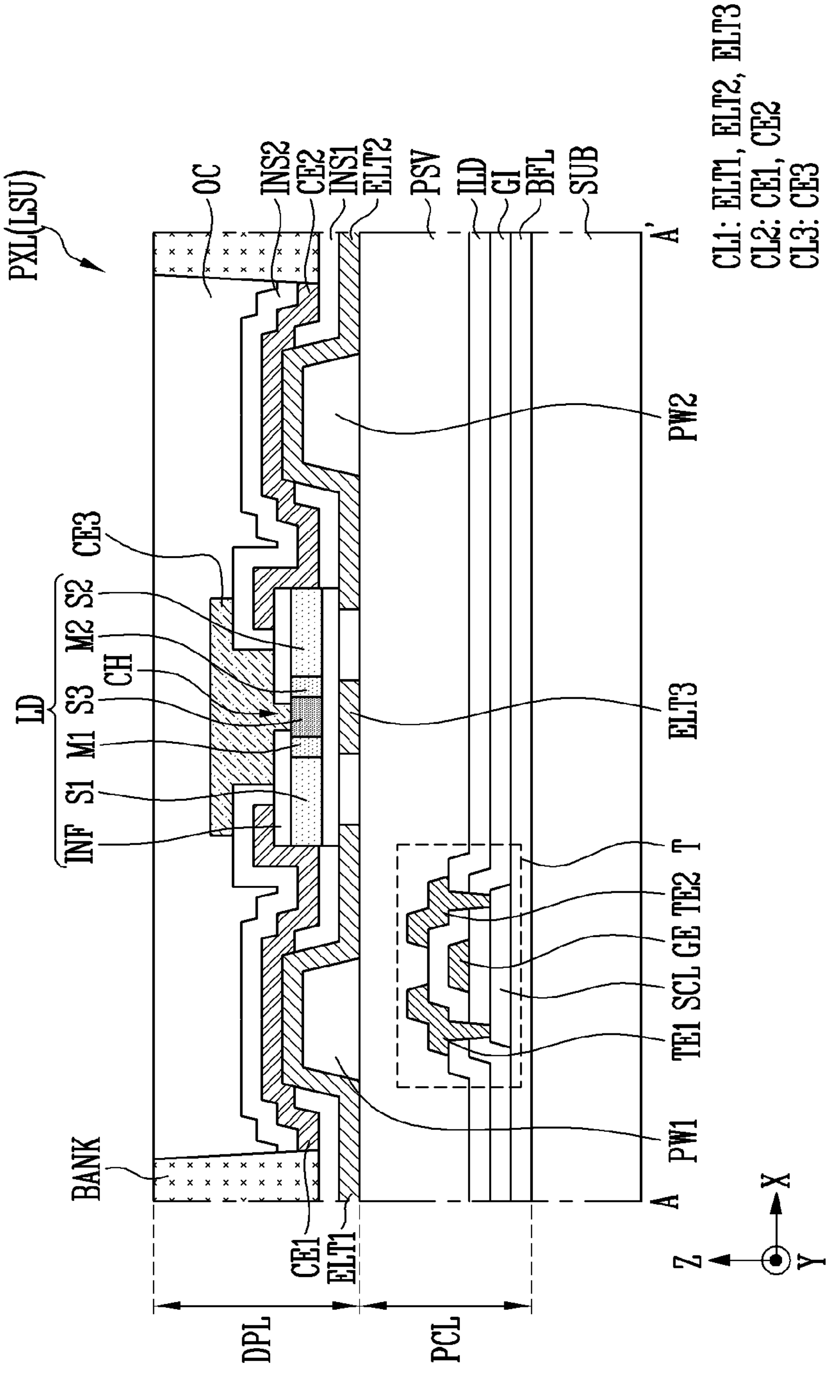
FIG. 12 illustrates a schematic cross-sectional view taken along line A-A' of FIG. 11.

FIG. 12 illustrates a cross-sectional view taken along line A-A' of FIG. 11.

Referring to FIG. 12, the pixel PXL and the display device including the same according to the embodiment include a circuit element layer PCL and a display element layer DPL sequentially disposed on one surface of the substrate SUB.

The circuit element layer PCL may include at least one circuit element electrically connected to the light emitting elements LD of each pixel PXL. For example, the circuit element layer PCL may include transistors T and a storage capacitor Cst included in each pixel circuit PXC. The circuit element layer PCL may further include at least one power line and/or signal line electrically connected to each pixel circuit PXC and/or the light emitting unit LSU.

For convenience of description, in FIG. 12, only one transistor T of circuit elements and wires arranged in the circuit element layer PCL will be representatively illustrated. However, a planar/cross-sectional structure of the circuit element layer PCL may be variously changed, and a position and cross-sectional structure of each transistor T may be variously changed according to embodiments.

The circuit element layer PCL may include insulating layers. For example, the circuit element layer PCL may include a buffer layer BFL, a gate insulating layer GI, an interlayer insulating layer ILD, and/or a passivation layer PSV sequentially stacked on one surface of the substrate SUB. In some embodiments, the circuit element layer PCL may further include at least one light blocking pattern (not shown) or the like disposed under the transistor T.

The buffer layer BFL may prevent impurities from diffusing into each circuit element. The buffer layer BFL may be formed as a single layer or may be formed as a multilayer of at least two layers or more. In case that the buffer layer BFL is provided as the multilayer, each layer of the buffer layer BFL may be made of the same material or different materials. Various circuit elements such as the transistors T and the storage capacitor Cst, and various wires electrically connected to the circuit elements may be disposed on the buffer layer BFL. In some embodiments, the buffer layer BFL may be omitted, and in this case, at least one circuit element and/or wire may be in direct contact with and/or directly disposed on one surface of the substrate SUB.

Each transistor T includes a semiconductor layer SCL (also referred to as a "semiconductor pattern" or "active layer"), a gate electrode GE, first and second transistor electrodes TE1 and TE2. FIG. 12 illustrates the embodiment in which each transistor T includes the first and second transistor electrodes TE1 and TE2 formed separately from the semiconductor layer SCL, but the disclosure is not limited thereto. For example, the first and second transistor electrodes TE1 and TE2 may be integrated with each semiconductor layer SCL.

The semiconductor layer SCL may be disposed on the buffer layer BFL. For example, the semiconductor layer SCL may be disposed between the substrate SUB on which the buffer layer BFL is formed and the gate insulating layer GI. The semiconductor layer SCL may include a first region electrically contacting each first transistor electrode TE1, a second region electrically contacting each second transistor electrode TE2, and a channel region disposed between the first and second regions. In some embodiments, one of the first and second regions may be a source region, and the other thereof may be a drain region.

In some embodiments, the semiconductor layer SCL may be a semiconductor pattern made of polysilicon, amorphous silicon, an oxide semiconductor, or the like. The channel region of the semiconductor layer SCL may be an intrinsic semiconductor as a semiconductor pattern that is not doped with impurities, and each of the first and second regions of the semiconductor layer SCL may be a semiconductor pattern doped with predetermined impurities.

In an embodiment, the semiconductor layer SCL of the transistors T forming each pixel circuit PXC may be made of substantially the same or similar material. For example, the semiconductor layer SCL of the transistors T may be made of one material of polysilicon, amorphous silicon, and an oxide semiconductor. In another embodiment, some of the transistors T and others of the transistors T may include a semiconductor layer SCL made of different materials. For example, the semiconductor layer SCL of some of the transistors T may be made of polysilicon or amorphous silicon, and the semiconductor layer SCL of others of the transistors T may be made of an oxide semiconductor.

The gate insulating layer GI may be disposed on the semiconductor layer SCL. For example, the gate insulating layer GI may be disposed between the semiconductor layer SCL and the gate electrode GE. The gate insulating layer GI may be formed as a single layer or multilayer and may include at least one inorganic insulating material and/or organic insulating material.

The gate electrode GE may be disposed on the gate insulating layer GI. For example, the gate electrode GE may be disposed to overlap the semiconductor insulating layer SCL with the gate insulating layer GI interposed therebetween. In FIG. 12, a top-gate structure transistor T is illustrated, but in another embodiment, the transistor T may have a bottom-gate structure. In this case, the gate electrode GE may be disposed under the semiconductor layer SCL to overlap the semiconductor layer SCL.

The interlayer insulating layer ILD may be disposed on the gate electrode GE. For example, the interlayer insulating layer ILD may be disposed between the gate electrode GE and the first and second transistor electrodes TE1 and TE2. The interlayer insulating layer ILD may be formed as a single layer or multilayer and may include at least one inorganic insulating material and/or organic insulating material.

The first and second transistor electrodes TE1 and TE2 may be disposed on each semiconductor layer SCL with at least one interlayer insulating layer ILD disposed therebetween. For example, the first and second transistor electrodes TE1 and TE2 may be disposed on different end portions of the semiconductor layer SCL with the gate insulating layer GI and the interlayer insulating layer ILD disposed therebetween. The first and second transistor electrodes TE1 and TE2 may be electrically connected to each semiconductor layer SCL. For example, the first and second transistor electrodes TE1 and TE2 may be electrically connected to the first and second regions of the semiconductor layers SCL through respective contact holes passing through the gate insulating layer GI and the interlayer insulating layer ILD. In some embodiments, one of the first and second transistor electrodes TE1 and TE2 may be a source electrode, and the other thereof may be a drain electrode.

The passivation layer PSV may be disposed on the circuit elements including the transistors T and/or the wires. The passivation layer PSV may be formed as a single layer or multilayer and may include at least one inorganic insulating material and/or organic insulating material. For example, the passivation layer PSV includes at least one organic insulating layer and may substantially flatten a surface of the circuit element layer PCL. The display element layer DPL may be disposed on the passivation layer PSV.

The display element layer DPL may be disposed on the circuit element layer PCL.

The display element layer DPL may include the light emitting unit LSU of each of the pixels PXL. For example, the display element layer DPL may include the first and second bank patterns PW1 and PW2, the first to third electrodes ELT1, ELT2, and ELT3, and the first to third contact electrodes CE1, CE2, and CE3 for more stably and electrically connecting the light emitting element LD between the first to third electrodes ELT1, ELT2, and ELT3, which are sequentially disposed and/or formed on the circuit element layer PCL.

The first and second bank patterns PW1 and PW2 may be disposed to be spaced apart from each other in the light emitting areas of each pixel PXL. The first and second bank patterns PW1 and PW2 may protrude in the third direction (Z-axis direction) on one surface of the substrate SUB on which the circuit element layer PCL is formed.

In some embodiments, the first and second bank patterns PW1 and PW2 may be disposed around at least a portion of the light emitting element LD so as to face one end or the other end of the light emitting element LD adjacent thereto. The first and second bank patterns PW1 and PW2 may include an insulating material including at least one inorganic material and/or organic material. For example, the first and second bank patterns PW1 and PW2 may include at least one layer of an inorganic film including various inorganic insulating materials currently known in addition to a silicon nitride (SiNx) or a silicon oxide (SiOx). As another example, the first and second bank patterns PW1 and PW2 may include at least one layer of an organic film and/or a photoresist film including various types of organic insulating materials currently known, or a single-layered or multi-layered insulator including a combination of organic/inorganic materials.

In an embodiment, the first and second bank patterns PW1 and PW2 may function as reflective members. For example, the first and second bank patterns PW1 and PW2 may guide the light emitted from each light emitting element LD in a desired direction along with the first and second electrodes ELT1 and ELT2 provided thereon to function as a reflective member that improves the light efficiency of the pixel PXL.

The first and second electrodes ELT1 and ELT2 of the light emitting unit LSU may be disposed on the first and second bank patterns PW1 and PW2, and the third electrode ELT3 may be disposed between the first and second electrodes ELT1 and ELT2. The third electrode ELT3 may be in direct contact with and/or directly disposed on the circuit element layer PCL. The first and second electrodes ELT1 and ELT2 may protrude in the third direction (Z-axis direction) while having inclined or curved surfaces corresponding to the first and second bank patterns PW1 and PW2 disposed below.

The first to third electrodes ELT1, ELT2, and ELT3 may be formed of the same conductive layer. For example, the first to third electrodes ELT1, ELT2, and ELT3 may be formed of a first conductive layer CL1. For example, the first conductive layer CL1 may include at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the same; a conductive oxide such as an indium tin oxide (ITO), an indium zinc oxide (IZO), a zinc oxide (ZnO), an antimony zinc oxide (AZO), an indium tin zinc oxide (ITZO), or a tin oxide (SnO2); and at least one conductive material among conductive polymers such as PEDOT, but are not limited thereto. The first conductive layer CL1 may be formed as a single layer or a multilayer. For example, the first conductive layer CL1 may include at least one reflective electrode layer. The first conductive layer CL1 may selectively include at least one of at least one transparent electrode layer disposed at an upper portion and/or a lower portion of the reflective electrode layer and at least one conductive capping layer covering an upper portion of the reflective electrode layer and/or the transparent electrode layer.

A first insulating layer INS1 may be disposed on one region of the first to third electrodes ELT1, ELT2, and ELT3. For example, the first insulating layer INS1 may be formed to cover or overlap one region of the first to third electrodes ELT1, ELT2, and ELT3 and may include an opening exposing the other region of the first to third electrodes ELT1, ELT2, and ELT3. In some embodiments, the first insulating layer INS1 may be omitted. The first and second contact electrodes CE1 and CE2, which will be described below, may electrically contact the first and second electrodes ELT1 and ELT2 through an opening of the first insulating layer INS1. The first insulating layer INS1 may be formed as a single layer or multilayer and may include at least one inorganic insulating material and/or organic insulating material.

Light emitting elements LD may be provided and arranged in each pixel area in which the first insulating layer INS1 is formed, particularly, in a light emitting area of each pixel PXL. For example, light emitting elements LD may be provided in the light emitting area of each pixel PXL through an inkjet method, a slit coating method, or various other methods, and the light emitting elements LD may be aligned by an alignment signal (or alignment voltage). For example, they may be aligned in the first direction (X-axis direction) so that the first semiconductor layer S1 of the light emitting element LD may be adjacent to the first electrode ELT1, the second semiconductor layer S2 thereof may be adjacent to the second electrode ELT2, and the third semiconductor layer S3 thereof may overlap the third electrode ELT3. As described above, in the case of using the light emitting element LD of the NPN and/or PNP junction, since both ends of the light emitting element LD include the same type of semiconductor layer, it is possible to prevent a non-light emitting defect due to deflection alignment. For example, it is possible to prevent the non-light emitting defect of the reverse-direction light emitting element due to the existing deflection alignment, thereby improving the material efficiency.

After the light emitting elements LD are aligned, one region of the insulating film INF of the light emitting element LD that overlaps the third semiconductor layer S3 may be partially removed. Accordingly, the insulating film INF may include a contact hole CH exposing one surface of the third semiconductor layer S3. The third contact electrode CE3, which will be described below, may be electrically connected to the third semiconductor layer S3 through the contact hole CH of the insulating film INF.

The first and second contact electrodes CE1 and CE2 may be disposed on the first and second electrodes ELT1 and ELT2 and the light emitting element LD. One end and the other end of the light emitting element LD may be covered or overlapped by the first and second contact electrodes CE1 and CE2. For example, the first contact electrode CE1 may electrically contact the first semiconductor layer S1 of the light emitting element LD and may electrically contact the first electrode ELT1 through the opening of the first insulating layer INS1. For example, the first contact electrode CE1 may serve to electrically connect the first electrode ELT1 and the first semiconductor layer S1 of the light emitting element LD. The second contact electrode CE2 may electrically contact the second semiconductor layer S2 of the light emitting element LD and may electrically contact the second electrode ELT2 through the opening of the first insulating layer INS1. For example, the second contact electrode CE2 may serve to electrically connect the second electrode ELT2 and the second semiconductor layer S2 of the light emitting element LD.

The first and second contact electrodes CE1 and CE2 may be formed of the same conductive layer. For example, the first and second contact electrodes CE1 and CE2 may be simultaneously formed on the same layer. Accordingly, a manufacturing process of the pixel PXL and the display device having the pixel PXL may be simplified. Specifically, the first and second contact electrodes CE1 and CE2 may be formed of a second conductive layer CL2. The second conductive layer CL2 may include various transparent conductive materials. For example, the second conductive layer CL2 may include at least one of various transparent conductive materials in addition to ITO, IZO, and ITZO, and may be implemented to be substantially transparent or transflective to satisfy a predetermined light transmittance. Accordingly, light emitted from one end and the other end of the light emitting elements LD may transmit through the first and second contact electrodes CE1 and CE2 to be emitted to the outside of the display device.

A second insulating layer INS2 may be disposed on the first and second contact electrodes CE1 and CE2. The second insulating layer INS2 may serve to insulate the first and second contact electrodes CE1 and CE2 from the third contact electrode CE3. The second insulating layer INS2 covers or overlaps the first and second contact electrodes CE1 and CE2 but may include an opening overlapping the third semiconductor layer S3 of the light emitting element LD. The third contact electrode CE3, which will be described below, may be electrically connected to the third semiconductor layer S3 through the opening of the second insulating layer INS2. The second insulating layer INS2 may be formed as a single layer or multilayer and may include at least one inorganic insulating material and/or organic insulating material.

The third contact electrode CE3 may be disposed on the second insulating layer INS2. The third contact electrode CE3 may be disposed in the opening of the second insulating layer INS2. The third contact electrode CE3 may be disposed to overlap the third semiconductor layer S3 of the light emitting element LD. The third contact electrode CE3 may electrically contact the third semiconductor layer S3 through the contact hole CH of the insulating film INF.

The third contact electrode CE3 may be formed of a conductive layer different from the first and second contact electrodes CE1 and CE2. For example, the third contact electrode CE3 may be formed of the third conductive layer CL3. The third conductive layer CL3 may include various transparent conductive materials. For example, the third conductive layer CL3 may include at least one of various transparent conductive materials in addition to ITO, IZO, and ITZO and may be implemented to be substantially transparent or transflective to satisfy a predetermined light transmittance. The third conductive layer CL3 and the second conductive layer CL2 may be formed of the same material, but the embodiments are not limited thereto.

An overcoat layer OC may be disposed on the third contact electrode CE3. The overcoat layer OC may cover the first to third conductive layers CL1, CL2, and CL3 and the light emitting element LD disposed below. The overcoat layer OC may reduce a step caused by various configurations disposed below. The overcoat layer OC may include an inorganic insulating film made of an inorganic material or an organic insulating film made of an organic material. The overcoat layer OC may be formed as a single layer, but is not limited thereto, and may be formed as a multilayer including an organic insulating film and an inorganic insulating film.

According to the above-described embodiment, since the display device includes the light emitting element LD of the NPN and/or PNP junction, it is possible to prevent non-lighting defects of the reverse light emitting elements due to the existing deflection alignment, thereby improving material efficiency. Since heat generation and resistance due to the reverse light emitting element may be reduced, lifespan of the display panel PNL may be improved.

Hereinafter, a display device according to another embodiment of the present invention will be described. The same elements as those described above will be referred to the same reference numerals in embodiments below, and redundant descriptions will be omitted or simplified.

Figure 13:
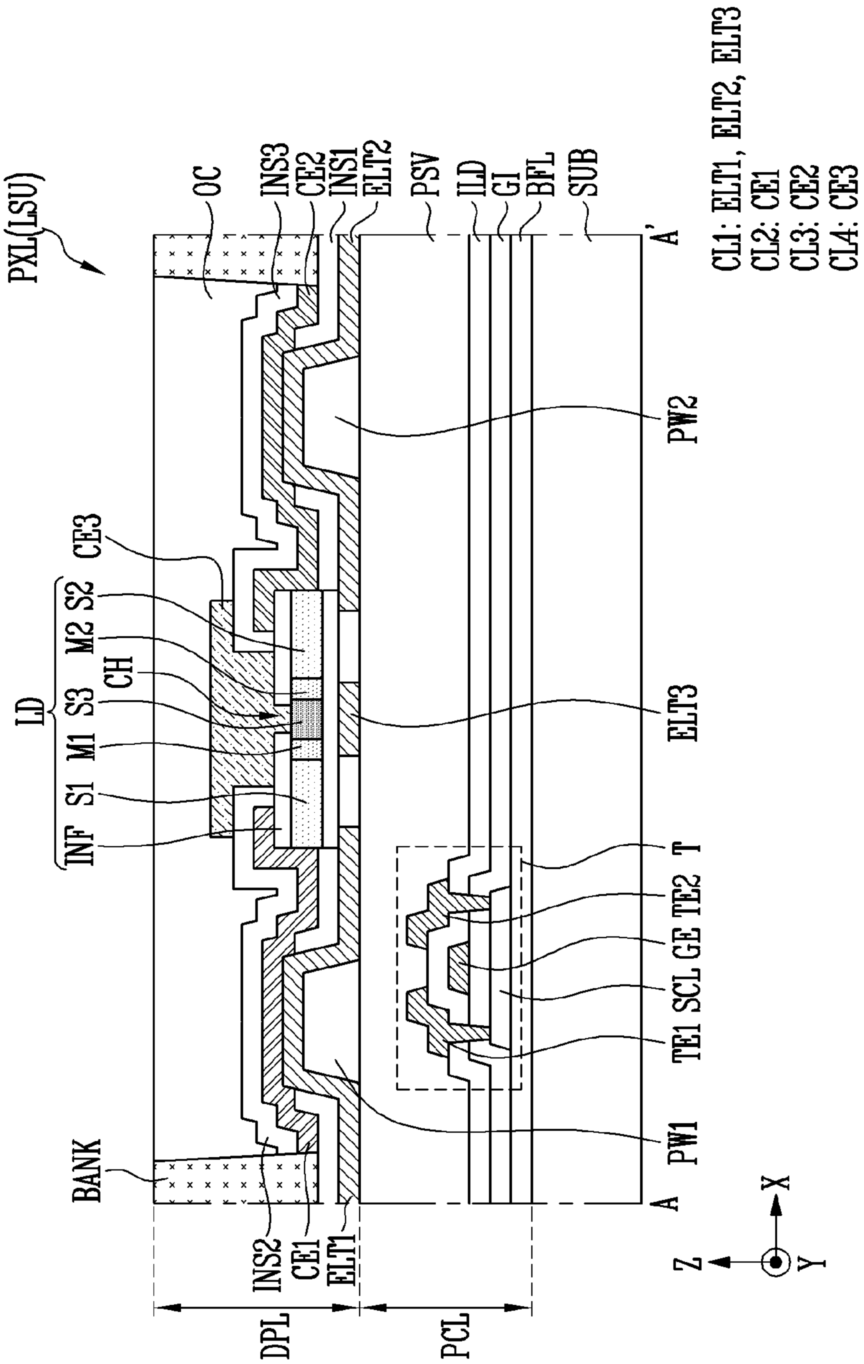
FIG. 13 illustrates a schematic cross-sectional view of a pixel according to another embodiment.

FIG. 13 illustrates a schematic cross-sectional view of a pixel according to another embodiment.

Referring to FIG. 13, the pixel PXL according to the present embodiment is different from the embodiments of FIG. 1 to FIG. 12 at least in that the first contact electrode CE1 and the second contact electrode CE2 are formed of different conductive layers.

Specifically, the first contact electrode CE1 and the second contact electrode CE2 may be divided into groups, and sequentially formed on different layers on a surface of the substrate SUB for each group. For example, the first contact electrode CE1 may be formed of the second conductive layer CL2, and the second contact electrode CE2 may be formed of the third conductive layer CL3. The second insulating layer INS2 may be disposed on the second conductive layer CL2 (or the first contact electrode CE1), and the third insulating layer INS3 may be disposed on the third conductive layer CL3 (or the second contact electrode CE2). After the second conductive layer CL2 is formed, the second insulating layer INS2 may be formed, and after the third conductive layer CL3 is formed, the third insulating layer INS3 may be sequentially formed. The second insulating layer INS2 and the third insulating layer INS3 may cover the second conductive layer CL2 (or the first contact electrode CE1) and the third conductive layer CL3 (or the second contact electrode CE2), respectively, and may be spaced apart from each other. For example, the second insulating layer INS2 and the third insulating layer INS3 may be spaced apart from each other with the third semiconductor layer S3 of the light emitting element LD disposed therebetween. For example, the second insulating layer INS2 and the third insulating layer INS3 may not overlap the third semiconductor layer S3. The third contact electrode CE3 may be disposed in a space in which the second insulating layer INS2 and the third insulating layer INS3 are apart from each other. The third contact electrode CE3 may be in direct contact with and/or directly disposed on the second insulating layer INS2 and the third insulating layer INS3. The third contact electrode CE3 may be disposed in a space in which the second insulating layer INS2 and the third insulating layer INS3 are spaced apart from each other to electrically contact the third semiconductor layer S3 through the contact hole CH of the insulating film INF. The third contact electrode CE3 may be formed of a fourth conductive layer CL4.

Figure 14:
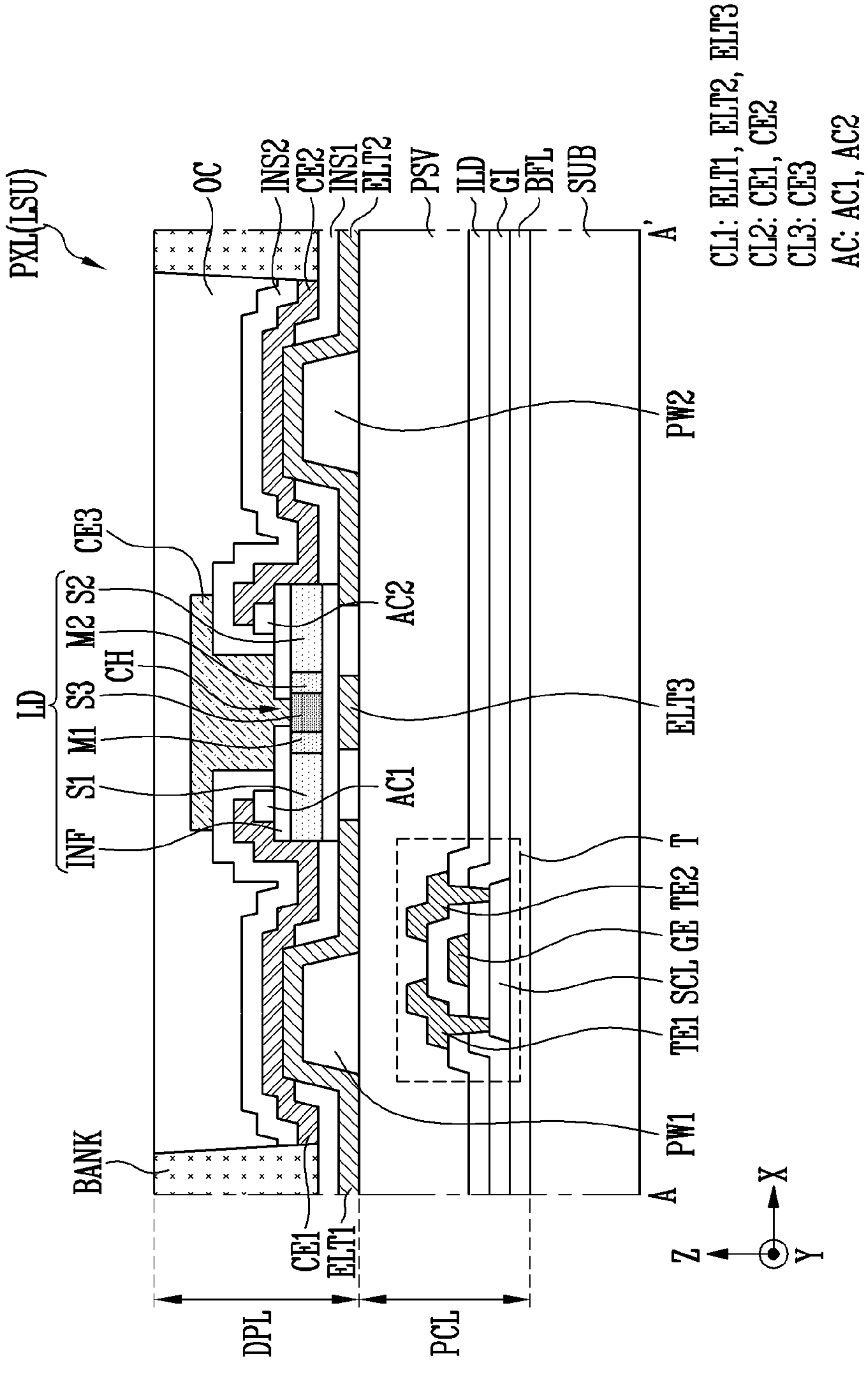
FIG. 14 illustrates a schematic cross-sectional view of a pixel according to another embodiment.

FIG. 14 illustrates a schematic cross-sectional view of a pixel according to another embodiment.

Referring to FIG. 14, the pixel PXL according to the present embodiment is different from the embodiments of FIG. 1 to FIG. 12 at least in that it further includes a fixed layer AC disposed on the light emitting element LD.

Specifically, the fixed layer AC may be disposed on one region of the light emitting element LD. For example, the fixed layer AC may be partially disposed on the light emitting element LD while exposing one end and the other end of each of the light emitting elements LD. The fixed layer AC may be formed to have an independent pattern on the light emitting area of each pixel PXL but is not limited thereto. When the fixed layer AC is formed on the light emitting elements LD after the alignment of the light emitting elements LD is completed, it is possible to prevent the light emitting elements LD from deviating from an aligned position. The fixed layer AC may be formed as a single layer or multilayer and may include at least one inorganic insulating material and/or organic insulating material.

The fixed layer AC may include a first fixed layer AC1 disposed between the first semiconductor layer S1 and the first contact electrode CE1 and a second fixed layer AC2 disposed between the second semiconductor layer S2 and the second contact electrode CE2. The first fixed layer AC1 and the second fixed layer AC2 may be simultaneously formed by the same process. The first fixed layer AC1 and the second fixed layer AC2 may be spaced apart from each other. For example, the first fixed layer AC1 and the second fixed layer AC2 may be spaced apart from each other with the third semiconductor layer S3 of the light emitting element LD disposed therebetween. For example, the first fixed layer AC1 and the second fixed layer AC2 may not overlap the third semiconductor layer S3. The third contact electrode CE3 may be disposed in a space in which the first fixed layer AC1 and the second fixed layer AC2 are spaced apart from each other. The third contact electrode CE3 may be disposed in a space in which the first fixed layer AC1 and the second fixed layer AC2 are spaced apart from each other to contact the third semiconductor layer S3 through the contact hole CH of the insulating film INF.

Figure 15:
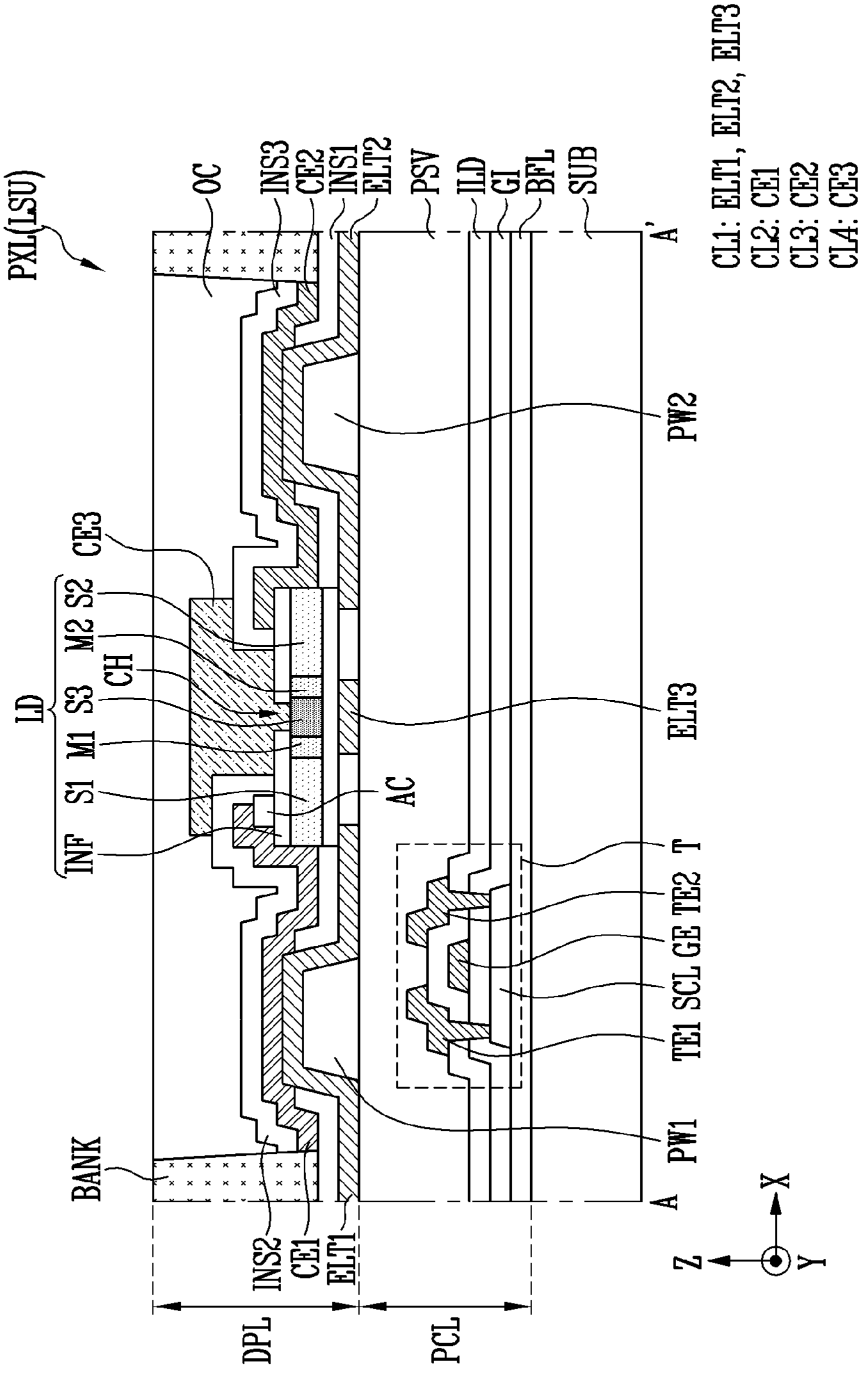
FIG. 15 illustrates a schematic cross-sectional view of a pixel according to another embodiment.

FIG. 15 illustrates a schematic cross-sectional view of a pixel according to another embodiment.

Referring to FIG. 15, the pixel PXL according to the present embodiment is different from the embodiments of FIG. 1 to FIG. 12 at least in that the first contact electrode CE1 and the second contact electrode CE2 are formed of different conductive layers and it further includes the fixed layer AC disposed on the light emitting element LD.

Specifically, the first contact electrode CE1 and the second contact electrode CE2 may be divided into multiple groups and may be sequentially formed on different layers on one surface of the substrate SUB for each group. For example, the first contact electrode CE1 may be formed of the second conductive layer CL2, and the second contact electrode CE2 may be made of the third conductive layer CL3. In this case, the second insulating layer INS2 may be disposed on the second conductive layer CL2 (or the first contact electrode CE1), and the third insulating layer INS3 may be disposed on the third conductive layer CL3 (or the second contact electrode CE2). After the second conductive layer CL2 is formed, the second insulating layer INS2 may be formed, and after the third conductive layer CL3 is formed, the third insulating layer INS3 may be sequentially formed.

The fixed layer AC may be disposed between the first semiconductor layer S1 of the light emitting element LD and the first contact electrode CE1. After the alignment of the light emitting elements LD is completed, the fixed layer AC may prevent the light emitting elements LD from deviating from the aligned position. In the drawings, the case in which the fixed layer AC is partially disposed between the first semiconductor layer S1 and the first contact electrode CE1 (or the second conductive layer CL2) is illustrated, but the disclosure is not limited thereto. For example, when the second conductive layer CL2 is formed after the third conductive layer CL3 is formed, the fixed layer AC may be partially disposed between the second semiconductor layer S2 and the second contact electrode CE2 (or the third conductive layer CL3).

Those skilled in the art related to the present embodiment will readily appreciate that many modifications are possible without materially departing from the novel teachings and advantages. The embodiments should be considered in a descriptive sense only and not for purposes of limitation. The scope of the claimed invention may be defined by the appended claims, and all modifications within the equivalent scope will be construed as being included in the disclosure.

What is claimed is:

1. A display device comprising:

a light emitting element, the light emitting element being cylindrically shaped having a length and a diameter, the light emitting element including:

a first semiconductor layer at a first distal end of the light emitting element;

a second semiconductor layer at a second distal end of the light emitting element; and a third semiconductor layer disposed directly between the first semiconductor layer and the second semiconductor layer such that the first semiconductor layer, the second semiconductor layer, and the third semiconductor layer are disposed along a straight line;

a first contact electrode electrically connected to the first semiconductor layer of the light emitting element;

a second contact electrode electrically connected to the second semiconductor layer of the light emitting element;

a third contact electrode disposed between the first contact electrode and the second contact electrode and electrically connected to the third semiconductor layer of the light emitting element;

a first electrode electrically connected to the first contact electrode;

a second electrode electrically connected to the second contact electrode;

a third electrode disposed between the first electrode and the second electrode and electrically connected to the third contact electrode, the third electrode disposed under the third semiconductor layer so as to overlap the third semiconductor layer, wherein the first semiconductor layer of the light emitting element and the second semiconductor layer of the light emitting element are doped with a first dopant having a first polarity, and the third semiconductor layer of the light emitting element is doped with a second dopant having a second polarity different from the first polarity, and in a plan view, each of the first electrode, the second electrode, and the third electrode extends along one direction, and the first electrode, the second electrode, and the third electrode are spaced apart from each other, and in the plan view, the first electrode at least partially overlaps the first semiconductor layer, and in the plan view, the second electrode at least partially overlaps the second semiconductor layer, and in the plan view, each of the first electrode and the second electrode does not overlap the third semiconductor layer, and at least a portion of the light emitting element is interposed between the third electrode and the third contact electrode; and an integral single-piece insulating film overlapping the first semiconductor layer, the first active layer, the third semiconductor layer, the second active layer, and the second semiconductor layer in the plan view, wherein the integral single-piece insulating film includes a contact hole overlapping the third semiconductor layer in the plan view, and the third contact electrode overlaps the first semiconductor layer, the second semiconductor layer, and the third semiconductor layer in the plan view, and is electrically connected to the third semiconductor layer through the contact hole.

2. The display device of claim 1, wherein the light emitting element further includes:
a first active layer disposed between and directly contacting both the first semiconductor layer of the light emitting element and the third semiconductor layer of the light emitting element;
a second active layer disposed between and directly contacting both the second semiconductor layer of the light emitting element and the third semiconductor layer of the light emitting element,
wherein
the first semiconductor layer, the first active layer, the third semiconductor layer, the second active layer, and the second semiconductor layer are disposed along a straight line.

3. The display device of claim 2, wherein
the integral single-piece insulating film includes a first opening at the first distal end to expose the first semiconductor layer, a second opening at the second distal end to expose the second semiconductor layer, and the contact hole spaced apart from the first opening and the second opening to expose the third semiconductor layer.

4. The display device of claim 2, wherein the contact hole is spaced apart from any distal end of the integral single-piece insulating film.

5. The display device of claim 4, wherein the third contact electrode directly contacts the third semiconductor layer of the light emitting element through the contact hole.

6. The display device of claim 1, wherein
the first contact electrode and the second contact electrode are formed of a first conductive layer,
the third contact electrode is formed of a second conductive layer, and
an insulating layer is disposed between the first conductive layer and the second conductive layer.

7. The display device of claim 6, wherein the insulating layer includes an opening overlapping the third semiconductor layer of the light emitting element.

8. The display device of claim 7, wherein at least a part of the third contact electrode is disposed in the opening of the insulating layer.

9. The display device of claim 6, further comprising:
a fixed layer disposed between the light emitting element and the first conductive layer.

10. The display device of claim 9, wherein the fixed layer includes:
a first fixed layer disposed between the first semiconductor layer of the light emitting element and the first contact electrode; and
a second fixed layer disposed between the second semiconductor layer of the light emitting element and the second contact electrode.

11. The display device of claim 1, wherein
the first contact electrode is formed of a first conductive layer,
the second contact electrode is formed of a second conductive layer, and
the display device further including:
a first insulating layer covering the first conductive layer; and
a second insulating layer covering the second conductive layer.

12. The display device of claim 11, wherein the first insulating layer and the second insulating layer do not overlap the third semiconductor layer of the light emitting element.

13. The display device of claim 11, wherein the third contact electrode is disposed in direct contact with the first insulating layer and the second insulating layer.

14. The display device of claim 1, further comprising an electrode layer having a cylindrical shape and directly disposed on the distal end of the first semiconductor layer and that forms an ohmic contact with the first semiconductor layer.

15. A display device, comprising:
a first electrode;
a second electrode spaced apart from the first electrode;
a third electrode disposed between the first electrode and the second electrode;
a light emitting element disposed between the first electrode and the second electrode, the light emitting element being cylindrically shaped having a length and a diameter, the light emitting element including a semiconductor core and an insulating film surrounding at least a part of the semiconductor core;
a first contact electrode electrically contacting the first electrode and a first distal end of the semiconductor core of the light emitting element;
a second contact electrode electrically contacting the second electrode and a second distal end of the semiconductor core of the light emitting element; and
a third contact electrode disposed between the first contact electrode and the second contact electrode, wherein
the third contact electrode electrically contacts the semiconductor core through a contact hole passing through the insulating film at a location spaced apart from the first distal end and the second distal end so as to electrically connect the third electrode to the semiconductor core, and
the third contact electrode is spaced apart from the first contact electrode and the second contact electrode, and
the semiconductor core includes a first semiconductor layer, a second semiconductor layer, and a third semiconductor layer disposed between the first semiconductor layer and the second semiconductor layer,
the insulating film has an integral single-piece form that completely surrounds a portion of the semiconductor core as seen in an end view with the first semiconductor layer, the second semiconductor layer, and the third semiconductor layer directly contacting the insulating film, wherein the contact hole overlaps the third semiconductor layer in a plan view, and the third contact electrode overlaps the first semiconductor layer, the second semiconductor layer, and the third semiconductor layer in the plan view, and is electrically connected to the third semiconductor layer through the contact hole;
the third electrode is disposed under the third semiconductor layer so as to overlap the third semiconductor layer, and
in the plan view, each of the first electrode, the second electrode, and the third electrode extends along one direction, and the first electrode, the second electrode, and the third electrode are spaced from each other, and
in the plan view, the first electrode at least partially overlaps the first semiconductor layer, and
in the plan view, the second electrode at least partially overlaps the second semiconductor layer, and in the plan view, each of the first electrode and the second electrode does not overlap the third semiconductor layer, and at least a portion of the light emitting element is interposed between the third electrode and the third contact electrode.

16. The display device of claim 15, wherein the third contact electrode directly contacts the third semiconductor layer of the semiconductor core through the contact hole.

17. The display device of claim 15, wherein the first contact electrode electrically contacts the first semiconductor layer of the semiconductor core, and the second contact electrode electrically contacts the second semiconductor layer of the semiconductor core.

18. The display device of claim 15, wherein the first semiconductor layer of the semiconductor core and the second semiconductor layer of the semiconductor core are doped with a first dopant having a first polarity, and the third semiconductor layer of the semiconductor core is doped with a second dopant having a second polarity different from the first polarity.

19. The display device of claim 15, wherein the semiconductor core further includes:

a first active layer disposed between and directly contacting both the first semiconductor layer and the third semiconductor layer; and a second active layer disposed between and directly contacting both the second semiconductor layer and the third semiconductor layer, wherein the first semiconductor layer, the first active layer, the third semiconductor layer, the second active layer, and the second semiconductor layer are disposed along a straight line.

20. The display device of claim 15, wherein the insulating film includes a first opening at the first distal end to expose the first semiconductor layer, a second opening at the second distal end to expose the second semiconductor layer, and the contact hole is spaced apart from the first opening and the second opening to expose the third semiconductor layer.

* * * * *